(12) United States Patent
Prinz et al.

(10) Patent No.: US 11,936,051 B2
(45) Date of Patent: Mar. 19, 2024

(54) ELECTROCHEMICAL CATALYSTS WITH ENHANCED CATALYTIC ACTIVITY

(71) Applicants: The Board of Trustees of the Leland Stanford Junior University, Stanford, CA (US); Volkswagen Aktiengesellschaft, Wolfsburg (DE)

(72) Inventors: Friedrich B. Prinz, Stanford, CA (US); Shicheng Xu, Stanford, CA (US); Yongmin Kim, Stanford, CA (US); Thomas Jaramillo, Stanford, CA (US); Drew C. Higgins, Stanford, CA (US); Maha Yusuf, Stanford, CA (US); Zhaoxuan Wang, Stanford, CA (US); Kyung Min Lee, Stanford, CA (US); Marat Orazov, Stanford, CA (US); Dong Un Lee, Stanford, CA (US); Tanja Graf, Wolfsburg (DE); Thomas Schladt, Wolfsburg (DE); Gerold Huebner, Wolfsburg (DE); Hanna-Lena Wittern, Wolfsburg (DE); Jonathan Edward Mueller, Wolfsburg (DE)

(73) Assignees: The Board of Trustees of the Leland Stanford Junior University, Stanford, CA (US); Volkswagen Aktiengesellschaf, Wolfsburg (DE)

(*) Notice: Subject to any disclaimer, the term of this patent is extended or adjusted under 35 U.S.C. 154(b) by 12 days.

(21) Appl. No.: 16/713,890

(22) Filed: Dec. 13, 2019

(65) Prior Publication Data
US 2020/0127300 A1    Apr. 23, 2020

Related U.S. Application Data

(63) Continuation-in-part of application No. PCT/US2018/037352, filed on Jun. 13, 2018.
(Continued)

(51) Int. Cl.
*H01M 4/92* (2006.01)
*C23C 16/455* (2006.01)
(Continued)

(52) U.S. Cl.
CPC ....... *H01M 4/925* (2013.01); *C23C 16/45525* (2013.01); *H01M 4/8668* (2013.01);
(Continued)

(58) Field of Classification Search
CPC .. H01M 4/925; H01M 4/8668; H01M 4/8807; H01M 4/881; H01M 4/8867;
(Continued)

(56) References Cited

U.S. PATENT DOCUMENTS

| 5,202,299 A | 4/1993 | Symons et al. |
|---|---|---|
| 6,631,062 B1 | 10/2003 | Minamisawa et al. |

(Continued)

FOREIGN PATENT DOCUMENTS

| CN | 101887978 A | 11/2010 |
|---|---|---|
| CN | 103053058 A | 4/2013 |

(Continued)

OTHER PUBLICATIONS

International Search Report and Written Opinion on PCT/2020/064646 dated May 7, 2021.
(Continued)

*Primary Examiner* — Raymond Alejandro
(74) *Attorney, Agent, or Firm* — Foley & Lardner LLP

(57) ABSTRACT

A catalyst structure includes: (1) a substrate; (2) a catalyst layer on the substrate; and (3) an adhesion layer disposed between the substrate and the catalyst layer. In some implementations, an average thickness of the adhesion layer is about 1 nm or less. In some implementations, a material of the catalyst layer at least partially extends into a region of
(Continued)

the adhesion layer. In some implementations, the catalyst layer is characterized by a lattice strain imparted by the adhesion layer.

19 Claims, 28 Drawing Sheets

Related U.S. Application Data

(60) Provisional application No. 62/519,056, filed on Jun. 13, 2017.

(51) Int. Cl.
*H01M 4/86* (2006.01)
*H01M 4/88* (2006.01)
*H01M 8/1004* (2016.01)
*H01M 8/10* (2016.01)

(52) U.S. Cl.
CPC ......... *H01M 4/8807* (2013.01); *H01M 4/881* (2013.01); *H01M 4/8867* (2013.01); *H01M 4/8892* (2013.01); *H01M 8/1004* (2013.01); H01M 2008/1095 (2013.01); H01M 2250/20 (2013.01); H01M 2300/0082 (2013.01)

(58) Field of Classification Search
CPC ............. H01M 4/8892; H01M 8/1004; H01M 2008/1095; H01M 2250/20; H01M 2300/0082; C23C 16/45525
See application file for complete search history.

(56) References Cited

U.S. PATENT DOCUMENTS

| | | |
|---|---|---|
| 8,399,152 B2 | 3/2013 | Yoshizawa et al. |
| 8,481,231 B2 | 7/2013 | Ji et al. |
| 9,373,850 B2 | 6/2016 | Harkness et al. |
| 9,666,876 B2 | 5/2017 | Pietrasz et al. |
| 9,979,028 B2 | 5/2018 | Kongkanand et al. |
| 11,299,810 B2 | 4/2022 | Suchsland et al. |
| 2007/0215945 A1 | 9/2007 | Tokunaga et al. |
| 2007/0237690 A1 | 10/2007 | Chen et al. |
| 2008/0261806 A1 | 10/2008 | Konstandopoulos et al. |
| 2009/0233790 A1 | 9/2009 | Vajda et al. |
| 2013/0260278 A1 | 10/2013 | Ji et al. |
| 2014/0306215 A1 | 10/2014 | Baker et al. |
| 2015/0086902 A1 | 3/2015 | Hards et al. |
| 2015/0086903 A1 | 3/2015 | Yoo |
| 2015/0093685 A1* | 4/2015 | Yang ............... H01M 4/9016 429/524 |
| 2015/0171433 A1 | 6/2015 | Kongkanand et al. |
| 2015/0360178 A1 | 12/2015 | Kalwei et al. |
| 2016/0093896 A1 | 3/2016 | Kakinuma et al. |

FOREIGN PATENT DOCUMENTS

| | | |
|---|---|---|
| CN | 104511276 A | 4/2015 |
| CN | 104916853 A | 9/2015 |
| CN | 105074980 A | 11/2015 |
| CN | 105312042 A | 2/2016 |
| DE | 10 2014 118 286 A1 | 6/2015 |
| DE | 10 2016 220 653 A1 | 4/2017 |
| EP | 3 493 311 A1 | 6/2019 |
| JP | 2001-089229 A | 4/2001 |
| JP | 2005-330133 | 12/2005 |
| JP | 2006-347841 A | 12/2006 |
| JP | 2008-176262 | 7/2008 |
| JP | 2009-021211 | 1/2009 |
| JP | 2009-235467 | 10/2009 |
| JP | 2013-243119 | 12/2013 |
| JP | 5379147 B2 | 12/2013 |
| JP | 2015-115324 | 6/2015 |
| JP | 2015-525675 | 9/2015 |
| JP | 2016-504191 A | 2/2016 |
| JP | 2016-072214 | 5/2016 |
| JP | 2017-073218 A | 4/2017 |
| KR | 10-2000-0069323 A | 11/2000 |
| KR | 1020170020427 A | 2/2017 |
| WO | WO-2011/057341 A1 | 5/2011 |
| WO | WO-2015/189680 A1 | 12/2015 |
| WO | WO-2018/049065 A1 | 3/2018 |

OTHER PUBLICATIONS

Clancey et al., "Atomic layer deposition of ultrathin platinum films on tungsten atomic layer deposition adhesion layers: Application to high surface area substrates", Journal of Vacuum Science & Technology A: Vacuum, Surfaces, and Films, 2015, Jan. vol. 33, No. 1, pp. 01A130-2 and 01A130-3.
International Search Report and Written Opinion issued in PCT Application No. PCT/US2018/037352 dated Nov. 1, 2018, 19 pages.
Foreign Action other than Search Report on CN 201880049238.X dated Jul. 20, 2021.
European Search Report on EP 18818743.9 dated Feb. 8, 2021.
International Preliminary Report on Patentability issued in PCT Application No. PCT/US2018/037352 dated Dec. 26, 2019, 15 pages.
Foreign Action other than Search Report on JP 2019-568036 dated Nov. 29, 2021.
Office Action on CN 201880049238.X, dated Feb. 16, 2022, 15 pages.
Foreign Action other than Search Report on JP 2019-568036 dated Aug. 31, 2023.
Foreign Office Action on Korean Application No. 10-2020-70000772 dated Apr. 27, 2023.

\* cited by examiner

ELECTROCHEMICAL CATALYSTS WITH ENHANCED CATALYTIC ACTIVITY

CROSS-REFERENCE TO RELATED APPLICATION

This application is a continuation-in-part of International Application No. PCT/US2018/037352, filed Jun. 13, 2018, which claims the benefit of U.S. Provisional Application No. 62/519,056, filed Jun. 13, 2017, the contents of which are incorporated herein by reference in their entirety.

DETAILED DESCRIPTION

Polymer electrolyte membrane (PEM) fuel cells have a great potential as power sources for applications such as zero emission vehicles. However, state-of-the-art PEM fuel cells suffer from several drawbacks. One of the most challenging drawback is the amount of costly platinum group metals (PGMs) in form of nano-sized particles (or nanoparticles), which serve as electrochemical catalysts in a membrane electrode assembly (MEA) of a fuel cell. The amount of a PGM catalyst is typically determined by a power specification per unit cell in a fuel cell stack. However, a significant additional amount of a PGM catalyst is typically included to account for several degradation processes and to allow a reliable operation over a lifetime of a fuel cell. Typical degradation processes are associated to loss of a PGM material or loss of catalytically active surface area and include: PGM particle dissolution and corrosion, PGM particle growth through Ostwald ripening, PGM particle agglomeration, PGM particle detachment from a carbonaceous support, and corrosion of a carbonaceous support.

It is against this background that a need arose to develop embodiments of this disclosure.

SUMMARY

In some embodiments, a catalyst structure includes (1) a substrate; (2) a catalyst layer on the substrate; and (3) an adhesion layer disposed between the substrate and the catalyst layer, wherein an average thickness of the adhesion layer is about 1 nm or less.

In some embodiments, a catalyst structure includes (1) a substrate; (2) a catalyst layer on the substrate; and (3) an adhesion layer disposed between the substrate and the catalyst layer, wherein a material of the catalyst layer at least partially extends into a region of the adhesion layer.

In some embodiments, a catalyst structure includes (1) a substrate; (2) a catalyst layer on the substrate; and (3) an adhesion layer disposed between the substrate and the catalyst layer, wherein the catalyst layer is characterized by a lattice strain imparted by the adhesion layer.

In some embodiments, a catalyst structure includes (1) a substrate and (2) a catalyst layer on the substrate, wherein the catalyst layer includes discrete regions that are spaced apart from one another, and at least one of the discrete regions includes a portion that is bonded to the substrate, and another portion that extends over the substrate and is spaced apart from the substrate by a gap.

In some embodiments, a catalyst structure includes (1) a substrate; (2) a catalyst layer on the substrate; and (3) an over-layer on the catalyst layer.

In some embodiments, a membrane electrode assembly for a fuel cell includes (1) a polymeric ion-conductive membrane and (2) an electrocatalyst layer adjacent to the polymeric ion-conductive membrane, wherein the electrocatalyst layer includes the catalyst structure of any one of the foregoing embodiments.

In some embodiments, a fuel cell includes (1) a cathode electrocatalyst layer; (2) an anode electrocatalyst layer; and (3) a polymeric ion-conductive membrane disposed between the cathode electrocatalyst layer and the anode electrocatalyst layer, wherein at least one of the cathode electrocatalyst layer or the anode electrocatalyst layer includes the catalyst structure of any one of the foregoing embodiments.

In some embodiments, a fuel cell includes (1) a first gas diffusion layer; (2) a second gas diffusion layer; and (3) a polymeric ion-conductive membrane disposed between the first gas diffusion layer and the second gas diffusion layer, wherein at least one of the first gas diffusion layer or the second gas diffusion layer includes the catalyst structure of any one of the foregoing embodiments.

In some embodiments, a method includes (1) depositing an adhesion layer on a substrate by atomic layer deposition to yield an adhesion layer-coated substrate; and (2) depositing a catalyst layer on the adhesion layer-coated substrate by atomic layer deposition to yield a catalyst-coated substrate.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DESCRIPTION

Metal/Ceramic Composite Electrochemical Catalysts:

Some embodiments of this disclosure are directed to an improved process of forming metal/ceramic composites for highly stable, highly active, and ultra-low loading catalysts for fuel cells, including PEM fuel cells, as well as resulting structures of the metal/ceramic composites. The formation of a thin film of a catalyst—stabilized by an underlying adhesion layer—provides higher stability compared to a nanoparticle form of the catalyst, as a result of the substantial absence of distinct surface defects, such as corners and edges, which are most prone to dissolution and corrosion, and the substantial immunity of the thin film to degradation processes impacting nanoparticles, such as Ostwald ripening and particle agglomeration. Through the use of atomic layer deposition, a thin film of a catalyst can be deposited with reduced thickness and high conformality. The reduced thickness of the thin film allows efficient use of the catalyst at low loading, and further translates into a higher mass activity with greater exposure of catalytic surface atoms in the thin film. Moreover, through the use of atomic layer deposition, one or more thin films of ceramics can be deposited adjacent to the catalyst to impart benefits such as rendering enhanced stability to the catalyst, rendering enhanced catalytic activity through, for example, strong metal support interaction (SMSI), as well as accelerating catalyst growth.

Figure 1A:
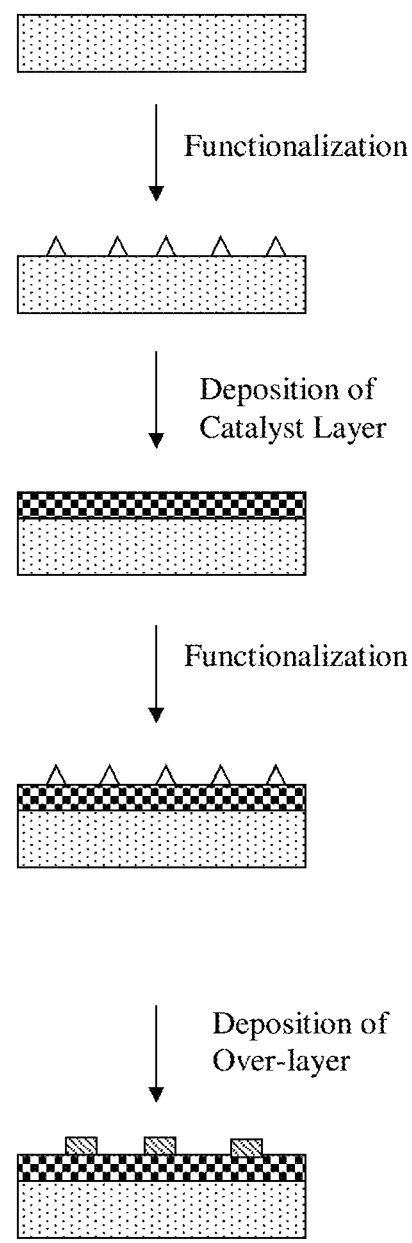
FIG. 1A. Schematic process flow of forming a thin film of a catalyst on a substrate, with an optional functionalization of the substrate prior to deposition of the catalyst.

FIG. 1A is a schematic process flow of forming a thin film of a catalyst on a substrate, with an optional functionalization of the substrate prior to deposition of the catalyst. In some embodiments, the substrate is a conductive support, such as a carbon-containing or carbonaceous support like carbon nanoparticles, carbon black, graphitic carbon, carbon nanotubes, carbon nanofibers, carbon microfibers, graphene sheets, other high surface area and conductive forms of carbon, as well as non-carbon-based conductive supports, such as titanium nitride supports and conductive oxide supports. In other embodiments, the substrate is a porous, conductive material that can be used as a gas diffusion layer, such as carbon cloth, carbon paper, or other carbonaceous or non-carbon-based fibrous material. Other types of substrates can be used, through suitable functionalization or selection of an adhesion layer as further discussed below.

Referring to FIG. 1A, the process flow includes optionally functionalizing the substrate to yield a functionalized substrate, followed by deposition of a set of one or more layers including a catalyst layer on the functionalized substrate. Functionalizing the substrate is performed to introduce anchoring or reactive functional groups to a surface of the substrate, to enhance or promote chemical bonding with precursors of a catalyst to be deposited on the substrate. In some embodiments, the substrate prior to functionalization is substantially devoid of anchoring groups and can be substantially inert towards deposition of the catalyst. For example, basal surfaces of pristine graphene sheets can be substantially inert toward atomic layer deposition of a PGM such as platinum (Pt), and performing atomic layer deposition of Pt on pristine graphene sheets can result in the formation of Pt nanoparticles on edges of the sheets. Functionalization of graphene sheets can involve the introduction of defect sites on basal surfaces, as manifested by, for example, the formation of $sp^3$-hybridized carbon (instead of $sp^2$-hybridized carbon in pristine graphene sheets), which promotes chemical bonding with precursors of the catalyst. In other embodiments, the substrate prior to functionalization includes some anchoring groups, and functionalization of the substrate introduces additional anchoring groups to yield a higher density and a higher uniformity of the anchoring groups across the surface of the substrate to promote subsequent formation of a thin film of the catalyst. Functionalizing the substrate can be performed by applying a plasma treatment, such as hydrogen plasma, oxygen plasma, hydrogen sulfide plasma, or nitrogen plasma, and can result in the formation of, for example, hydrogen-containing anchoring groups (e.g., hydrogenation to introduce —C—H groups), oxygen-containing anchoring groups (e.g., groups containing a —C—O— moiety or a carbonyl moiety), sulfur-containing anchoring groups, nitrogen-containing anchoring groups, or a combination of such groups. In place of, or in combination with, a plasma treatment, functionalizing the substrate can be performed by wet chemical treatment, such as surface oxide etching followed by treatment by oxidizing acids, or using bases or other reactive compounds, or by thermal treatment.

Next, deposition of the catalyst on the functionalized substrate is performed by chemical vapor deposition and, in particular, atomic layer deposition to yield a catalyst-coated substrate. The catalyst can be deposited as a single element material, for example, a single PGM, although deposition of a binary element material, a ternary element material, or other multi-element material is also encompassed by this disclosure. A process flow of atomic layer deposition includes performing a first atomic layer deposition cycle to deposit the material of the catalyst on the substrate held within a deposition chamber, followed by performing a second atomic layer deposition cycle to deposit the material on the substrate, followed by performing a third atomic layer deposition cycle to deposit the material on the substrate, and so on until a requisite amount of the material is deposited. Performing each atomic layer deposition cycle includes sequentially exposing the substrate, or a portion of the substrate, to deposition gases including a first precursor containing the material to be deposited, and a second oxidative precursor. In the case of a single element material, for example, the first precursor can be a PGM-containing precursor such as an organometallic compound with a PGM coordinated with organic ligands, and the second oxidative precursor can be oxygen, ozone, water, or oxygen plasma. For example, for the specific case of Pt, the first precursor can be trimethyl(methylcyclopentadienyl)platinum(IV) or another Pt-containing organometallic compound. In addition to Pt, deposition can be performed for other PGMs, such as ruthenium (Ru), rhodium (Rh), palladium (Pd), osmium (Os), and iridium (Ir), as well as other noble metals, such as silver (Ag) and gold (Au), and as well as other transition metals such iron (Fe), cobalt (Co), copper (Cu), and so forth. During the first atomic layer deposition cycle, the first precursor is introduced into the chamber to result in the first precursor being adsorbed to the substrate, in the form of molecules of the first precursor, residues of the molecules of the first precursor, or a combination of both, and the second oxidative precursor is introduced into the chamber to result in a reaction between the adsorbed first precursor and the second oxidative precursor to liberate ligands included in the adsorbed first precursor, thereby leaving the material deposited on the substrate. Anchoring groups on the substrate (introduced through functionalization) promotes adsorption of the first precursor to the substrate at a higher density and in a more uniform manner. In some embodiments, anchoring groups on the substrate can undergo a reaction with the adsorbed first precursor to result in the formation of bonds or linkages between carbon atoms of the substrate and metal atoms included in the adsorbed first precursor, either directly or indirectly through one or more intervening atoms, such as oxygen or nitrogen atoms. A second reductive precursor, such as hydrogen or hydrogen plasma, can be used in place of, or in combination with, the second oxidative precursor. A removal operation can be performed subsequent to introducing each precursor to remove reaction products and any unreacted precursor, such as by evacuation or purging with an inert carrier gas.

Optionally in some embodiments, a passivation gas is introduced into the chamber subsequent to introducing precursors in each atomic layer deposition cycle, including the first atomic layer deposition cycle, and prior to introducing precursors in a subsequent atomic layer deposition cycle. The passivation gas serves to tune or change an adsorption energy between the first precursor and the already-deposited material to render that adsorption energy less favorable such that subsequent adsorption of the first precursor will be preferential or promoted towards covering vacant areas of the substrate instead of the already-deposited material. In such manner, the use of the passivation gas enhances dispersion of the first precursor along the substrate and leads to enhanced and more uniform coverage of deposited material along the substrate, as well as allowing control over that coverage. In some embodiments, criteria for the passivation gas include one or more of the following: 1) ability to adsorb onto the deposited material; 2) exhibits greater tendency towards or has a stronger adsorption onto the deposited material compared to the substrate; 3) after adsorption onto the deposited material, the passivation gas forms an intermediate chemical species; and 4) an adsorption energy of the first precursor to the intermediate species is greater than (e.g., less negative or more positive than) about −10 kJ/mol (or greater than about −0.104 eV), such as about −5 kJ/mol or greater (or about −0.052 eV or greater), about 0 kJ/mol or greater (or about 0 eV or greater), or about 10 kJ/mol or greater (or about 0.104 eV or greater), or the adsorption energy of the first precursor to the intermediate species is greater than an adsorption energy of the first precursor to the substrate. For example, for the case of Pt or another single element material, the passivation gas can be carbon monoxide (CO). In addition to CO, other passivation gases satisfying the above-noted criteria can be used, such as reactive forms of ammonia ($NH_3$), nitric oxide (NO), and methane ($CH_4$). A process temperature can be controlled to mitigate against desorption of the passivation gas. For example, for the case of CO or another passivation gas, a temperature of the substrate can be controlled to be in a range from about 50° C. to about 250° C., from about 80° C. to about 200° C., or from about 100° C. to about 150° C.

The resulting catalyst layer can have an average thickness in a range of about 8 nm or less, about 7 nm or less, about 6 nm or less, about 5 nm or less, or about 4 nm or less, and down to about 1 nm or less. For example, the average thickness of the catalyst layer can be in a range of about 1 nm to about 4 nm. Stated in another way, the average thickness of the catalyst layer can be in a range of about 1 atomic layer to about 15 atomic layers, such as from about 3 atomic layers to about 12 atomic layers. In some embodiments for the case of Pt, a single atomic layer of Pt or 2 atomic layers of Pt may be somewhat less catalytically active than 3 or more atomic layers of Pt. In the case of a single element material, 1 atomic layer can correspond to a thickness of a single layer of atoms of the element. In the case of a binary element material having a molar composition of a % of a first element and b % of a second element, 1 atomic layer can correspond to a thickness of a single layer of atoms having an effective size given by (a/100)×(size of an atom of the first element)+(b/100)×(size of an atom of the second element). A similar weighted average according to a molar composition can be used to specify a thickness of 1 atomic layer for a ternary element material or other multi-element material. Desired thickness of the catalyst layer can be attained through control over process conditions of atomic layer deposition, including control over a number of atomic layer deposition cycles or an amount of the material of the catalyst layer that is deposited.

A surface coverage of the substrate by the catalyst layer can be partial or incomplete, or can be substantially complete. Desired surface coverage of the catalyst layer can be attained through control over process conditions of atomic layer deposition, including control over a number of atomic layer deposition cycles or an amount of the material of the catalyst layer that is deposited. The resulting catalyst layer can be in the form of a substantially continuous, conformal film, or a non-continuous, conformal film, such as having gaps or openings exposing the underlying substrate, or in the form of discrete regions that are spaced apart from one another to expose the underlying substrate. For example, the catalyst layer generally can provide a surface coverage of the substrate in a range of 0% to about 100% and, more particularly, can provide a surface coverage of the substrate of at least about 30%, such as at least about 40%, at least about 50%, at least about 60%, at least about 70%, at least about 80%, at least about 90%, at least about 95%, at least about 98%, at least about 98.5%, or at least about 99%, and up to about 100%. Surface coverage can be assessed using imaging techniques, such as using transmission electron microscopy (TEM) or scanning electron microscopy (SEM), Rutherford backscattering spectroscopy, X-ray photoelectron spectroscopy (XPS), atomic force microscopy (AFM), or inductively coupled plasma mass spectrometry (ICP-MS).

Next, referring to FIG. 1A, the process flow includes optionally depositing an over-layer (or a protective or capping layer) on the catalyst-coated substrate. The over-layer that is deposited on the catalyst layer renders enhanced stability to the catalyst layer by protecting the catalyst layer under corrosive or oxidizing environments. The over-layer also can provide additional benefits, such as an increase in catalytic activity due to attraction of reactant species. Examples of a material of the over-layer include metal or metalloid oxides (e.g., binary oxides, including binary oxides of univalent or multivalent metals or metalloids, such as tin oxide ($SnO_x$), aluminum oxide ($Al_xO_y$), zirconium oxide ($ZrO_x$), hafnium oxide ($HfO_x$), silicon oxide ($SiO_x$), titanium oxide ($TiO_x$ such as $TiO_2$), niobium oxide ($Nb_xO_y$ such as $Nb_2O_5$), tantalum oxide ($TaO_x$), vanadium oxide ($VO_x$), tungsten oxide ($WO_x$), cobalt oxide ($CoO_x$), nickel oxide ($NiO_x$), cerium oxide ($CeO_x$), and molybdenum oxide ($MoO_x$), and ternary, quaternary, or higher order oxides, such as strontium titanium oxide ($Sr_xTi_yO_z$ with or without doping)), metal or metalloid nitrides (e.g., titanium nitride (TiN), chromium nitride (CrN), and chromium aluminum nitride ($Cr_2AlN$)), metal or metalloid carbides (e.g., tungsten carbide (WC) and chromium aluminum carbide ($Cr_2AlC$)), metal or metalloid borides, metal or metalloid sulfides (e.g., zinc sulfide (ZnS)), metal or metalloid phosphides (e.g., titanium phosphide (TiP)), metal or metalloid silicides, other ceramics, or alloys or combinations of two or more of the foregoing.

Depositing the over-layer is performed by chemical vapor deposition and, in particular, atomic layer deposition. In the case of a metal or metalloid oxide, for example, performing each atomic layer deposition cycle includes sequentially exposing the catalyst-coated substrate, or a portion of the catalyst-coated substrate, to deposition gases including a first precursor containing a metal or metalloid and a second oxidative precursor. As another example, performing each atomic layer deposition cycle includes sequentially exposing the catalyst-coated substrate, or a portion of the catalyst-coated substrate, to deposition gases including a first precursor containing a first element of a material of the over-layer to be deposited, a second precursor containing a second element of the material to be deposited, and a third oxidative precursor. For example, the first element can be a metal or a metalloid, and the second element can be oxygen, nitrogen, carbon, boron, phosphorus, sulfur, or silicon. A third reductive precursor can be used in place of, or in combination with, an oxidative precursor.

Desirably, the over-layer can have a reduced thickness, and a surface coverage of the catalyst layer by the over-layer can be partial or incomplete, such that enhanced stability is rendered to the catalyst layer while maintaining sufficient exposure of catalytically active sites and mitigating against activation loss. Desired thickness and surface coverage of the over-layer can be attained through control over process conditions of atomic layer deposition, including control over a number of atomic layer deposition cycles or an amount of the material of the over-layer that is deposited. The resulting over-layer can be in the form of a porous or non-continuous, conformal film, such as having gaps or openings exposing the underlying catalyst layer, or can be in the form of discrete regions that are spaced apart from one another to expose the underlying catalyst layer. For example, the over-layer generally can provide a surface coverage of the catalyst layer in a range of less than about 100% and, more particularly, can provide a surface coverage of the catalyst layer of up to about 60%, such as about 55% or less, about 50% or less, about 45% or less, about 40% or less, about 35% or less, about 30% or less, about 25% or less, or about 20% or less, and down to about 15% or less, or down to about 10% or less. Surface coverage can be assessed using TEM or SEM imaging techniques, Rutherford backscattering spectroscopy, XPS, AFM, or ICP-MS. An average thickness of the over-layer can be in a range of about 3 nm or less, about 2 nm or less, or about 1 nm or less, and down to about 0.5 nm or less.

In some embodiments, the process flow includes optionally functionalizing the catalyst layer to yield a functionalized catalyst layer, followed by deposition of the over-layer on the functionalized catalyst layer. Functionalizing the catalyst layer is performed to introduce anchoring or reactive functional groups to a surface of the catalyst layer, to enhance or promote chemical bonding with precursors of the over-layer to be deposited on the catalyst layer. Functionalizing the catalyst layer can be performed by applying a plasma treatment, such as hydrogen plasma, oxygen plasma, hydrogen sulfide plasma, or nitrogen plasma, and can result in the formation of, for example, hydrogen-containing anchoring groups (e.g., hydrogenation to introduce —C—H groups), oxygen-containing anchoring groups (e.g., groups containing a —C—O— moiety or a carbonyl moiety), sulfur-containing anchoring groups, nitrogen-containing anchoring groups, or a combination of such groups. In place of, or in combination with, a plasma treatment, functionalizing the catalyst layer can be performed by wet chemical treatment, such as surface oxide etching followed by treatment by oxidizing acids, or using bases or other reactive compounds, or by thermal treatment.

In some embodiments, the process flow includes optionally intermixing the catalyst layer and the over-layer such that the material of the catalyst layer at least partially extends into or is incorporated within a region of the over-layer, the material of the over-layer at least partially extends into or is incorporated within a region of the catalyst layer, or both. For example, intermixing can be attained subsequent to deposition of the over-layer by inducing material inter-diffusion through application of plasma treatment or thermal treatment (e.g., a temperature in a range of about 400° C. to about 1000° C., about 600° C. to about 1000° C., or about 700° C. to about 900° C.) in a reducing atmosphere, such hydrogen gas or hydrogen plasma, or under vacuum conditions. Such post- or ex situ-treatment in a reducing atmosphere or under vacuum can introduce vacancies (e.g., oxygen vacancies) in the over-layer and promote diffusion of Pt or other PGM atoms in the catalyst layer to occupy the vacancies. As another example, intermixing can be attained as part of atomic layer deposition of the catalyst layer and the over-layer, where atomic layer deposition cycles to deposit the material of the catalyst layer are interspersed with atomic layer deposition cycles to deposit the material of the over-layer. In addition, intermixing or diffusion of Pt or other PGM atoms can be attained by performing electrochemical activation subsequent to deposition. As a result of intermixing, the material of the catalyst layer can be partially incorporated within the over-layer to generate a concentration gradient of the material of the catalyst layer over a thickness of the over-layer. For example, an atomic concentration of Pt or another PGM within the over-layer can be non-uniform over the thickness of the over-layer, and can vary from a value at an interface or a boundary between the catalyst layer and the over-layer along a direction extending away from the interface and into the over-layer, such as in a monotonic or other manner, or can vary from a value at an interface or a boundary between the over-layer and an external environment along a direction extending away from the interface and into the over-layer, such as in a monotonic or other manner. In some embodiments, the atomic concentration of Pt or another PGM within an outermost atomic layer of the over-layer can be about 90% or greater and up to about 100%. In some embodiments and as a result of intermixing, the material of the catalyst layer can react and form an alloy with the material of the over-layer. For example, Pt atoms (or atoms of another PGM or another metal) incorporated within the over-layer can form bonds with atoms of a metal element of the over-layer to form an alloy or a metal/ceramic composite within a region of the over-layer below the outermost atomic layer. For the specific case of Pt, Pt can form an alloy with a metal element M of the over-layer to form a Pt-M alloy, such as a platinum-titanium alloy. An atomic concentration of the metal element M within the alloy can be about 50% or greater and up to about 75% or greater. For example, a Pt-M alloy can include $PtTi_3$, PtTi, or both.

Figure 1B:
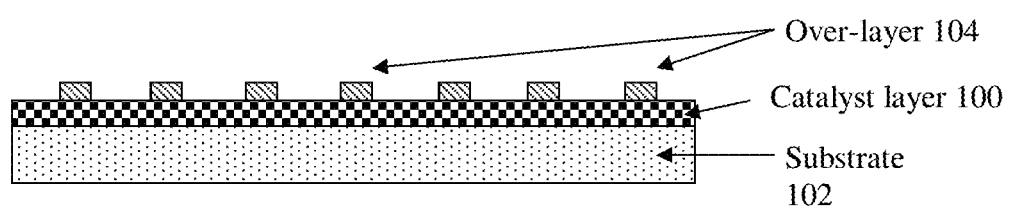
FIG. 1B. Schematic illustration of an example of a resulting structure from the process flow of FIG. 1A, in which a set of deposited layers including a catalyst layer covers a substrate.

FIG. 1B is a schematic illustration of an example of a resulting structure from the process flow of FIG. 1A, in which a set of deposited layers including a catalyst layer 100 covers a substrate 102. As shown, the catalyst layer 100 is in the form of a substantially continuous film, and a surface coverage of the substrate 102 by the catalyst layer 100 is substantially complete. A surface coverage of the catalyst layer 100 by an over-layer 104 is partial or incomplete, such that enhanced stability is rendered to the catalyst layer 100 while maintaining sufficient exposure of catalytically active sites.

Figure 1C:
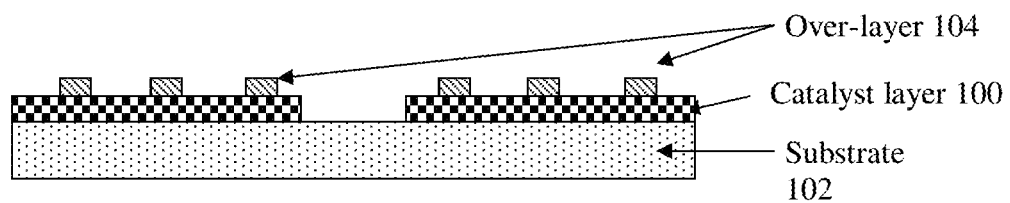
FIG. 1C. Schematic illustration of another example of a resulting structure from the process flow of FIG. 1A, in which a set of deposited layers including a catalyst layer covers a substrate.

FIG. 1C is a schematic illustration of another example of a resulting structure from the process flow of FIG. 1A, in which a set of deposited layers including a catalyst layer 100 covers a substrate 102. As shown, the catalyst layer 100 is in the form of a non-continuous film, and a surface coverage of the substrate 102 by the catalyst layer 100 is partial or incomplete. A surface coverage of the catalyst layer 100 by an over-layer 104 is also partial or incomplete, such that enhanced stability is rendered to the catalyst layer 100 while maintaining sufficient exposure of catalytically active sites.

Figure 1D:
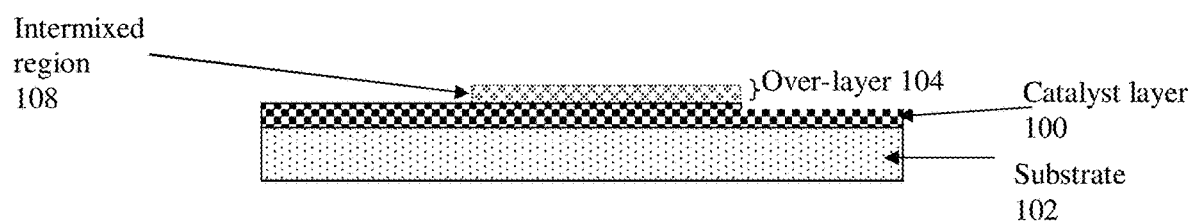
FIG. 1D. Schematic illustration of another example of a resulting structure from the process flow of FIG. 1A, in which a set of deposited layers including a catalyst layer covers a substrate.

FIG. 1D is a schematic illustration of another example of a resulting structure from the process flow of FIG. 1A, in which a set of deposited layers including a catalyst layer 100 covers a substrate 102, and an over-layer 104 covers the catalyst layer 100. As shown, the catalyst layer 100 and the over-layer 104 are intermixed such that the material of the catalyst layer 100 at least partially extends into or is incorporated within a region of the over-layer 104. As a result of intermixing, the material of the catalyst layer 100 is at least partially incorporated within the over-layer 104 to generate a concentration gradient of the material of the catalyst layer 100 over a thickness of the over-layer 104 in an intermixed region 108, and generate a concentration gradient of the material of the over-layer 104 over the thickness of the over-layer 104 in the intermixed region 108.

Figure 2A:
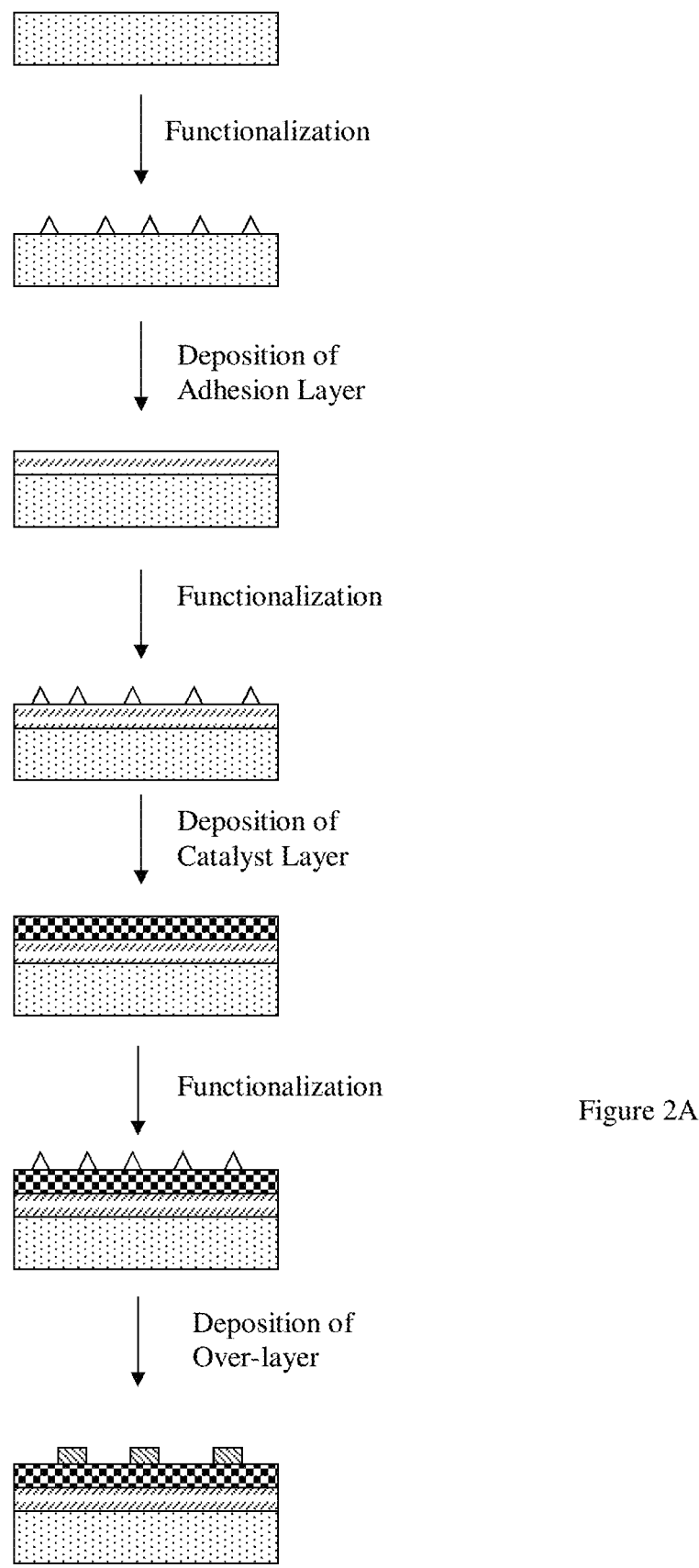
FIG. 2A. Schematic process flow of forming a thin film of a catalyst on a substrate.

FIG. 2A is another schematic process flow of forming a thin film of a catalyst on a substrate. Certain aspects of the process flow in FIG. 2A can be similarly performed as explained above for FIG. 1A, and those aspects are not repeated.

Referring to FIG. 2A, the process flow includes optionally functionalizing the substrate to yield a functionalized substrate, followed by deposition of a set of one or more layers including a catalyst layer on the functionalized substrate. Functionalizing the substrate can be similarly performed as explained above for FIG. 1A.

Next, the process flow includes depositing an adhesion layer (or an under-layer) on the functionalized substrate to yield an adhesion layer-coated substrate, followed by deposition of a catalyst layer on the adhesion layer-coated substrate. The adhesion layer includes a material that bonds strongly to both the substrate and the catalyst layer to render enhanced stability to the catalyst layer (see Example section—FIG. 8). In some embodiments, the adhesion layer includes anchoring or reactive functional groups on a surface of the adhesion layer, to enhance or promote chemical bonding with precursors of the catalyst to be deposited on the substrate. In some embodiments, the adhesion layer renders protection of edges, corners, or steps present in the catalyst layer against dissolution or surface rearrangement under fuel cell operating conditions (e.g., high electrochemical potentials and low pH's), whether with or without intermixing of the adhesion layer and the catalyst layer as further explained below. The adhesion layer also can provide additional benefits, such as an increase in catalytic activity through SMSI (e.g., including one or more of structural (e.g., lattice strain), electronic (e.g., d-band center shift), and ligand effects), and protecting the underlying substrate from oxidizing or corrosive environments under fuel cell operating conditions, whether with substantially complete coverage of the substrate or partial or selective deposition of the adhesion layer on defect sites of the underlying substrate. Further, the adhesion layer can promote a faster growth rate of the catalyst layer and can improve a growth behavior of the catalyst layer on the adhesion layer (see Example section—FIG. 9). In some embodiments, a material of the adhesion layer exhibits an improved wettability with respect to a material of the catalyst layer, as compared to the substrate, leading to an accelerated growth of the catalyst layer on the adhesion layer compared to direct growth on the substrate, and leading to an improved utilization of precursors of the catalyst layer and preferential growth of the catalyst layer on the adhesion layer rather than on exposed areas of the substrate (see Example section—FIG. 10). Examples of the material of the adhesion layer include those explained above for an over-layer, including metal or metalloid oxides, metal or metalloid nitrides, metal or metalloid carbides, metal or metalloid borides, metal or metalloid sulfides, metal or metalloid phosphides, metal or metalloid silicides, other ceramics, or alloys or combinations of two or more of the foregoing.

Depositing the adhesion layer is performed by chemical vapor deposition and, in particular, atomic layer deposition. In the case of a metal or metalloid oxide, for example, performing each atomic layer deposition cycle includes sequentially exposing the functionalized substrate, or a portion of the functionalized substrate, to deposition gases including a first precursor containing a metal or metalloid and a second oxidative precursor. As another example, performing each atomic layer deposition cycle includes sequentially exposing the functionalized substrate, or a portion of the functionalized substrate, to deposition gases including a first precursor containing a first element of a material of the over-layer to be deposited, a second precursor containing a second element of the material to be deposited, and a third oxidative precursor. For example, the first element can be a metal or a metalloid, and the second element can be oxygen, nitrogen, carbon, boron, phosphorus, sulfur, or silicon. A third reductive precursor can be used in place of, or in combination with, an oxidative precursor.

In some embodiments, the adhesion layer can have a reduced thickness, such that enhanced activity and stability are rendered to the catalyst layer by the adhesion layer, while the reduced thickness shortens an electrical pathway distance between the catalyst layer and the substrate, thereby mitigating against ohmic loss. Desired thickness and surface coverage of the adhesion layer can be attained through control over process conditions of atomic layer deposition, including control over a number of atomic layer deposition cycles or an amount of the material of the adhesion layer that is deposited. The resulting adhesion layer can be in the form of a substantially continuous, conformal film, or a non-continuous, conformal film, such as having gaps or openings exposing the underlying substrate, or in the form of discrete regions that are spaced apart from one another to expose the underlying substrate. For example, the adhesion layer generally can provide a surface coverage of the substrate in a range of 0% to about 100% and, more particularly, can provide a surface coverage of the substrate of at least about 30%, such as at least about 40%, at least about 50%, at least about 60%, at least about 70%, at least about 80%, at least about 90%, at least about 95%, at least about 98%, at least about 98.5%, or at least about 99%, and up to about 100%. Surface coverage can be assessed using TEM or SEM imaging techniques, Rutherford backscattering spectroscopy, XPS, AFM, or ICP-MS. In some embodiments, an average thickness of the adhesion layer can be in a range of about 3 nm or less, about 2 nm or less, or about 1 nm or less, and down to about 0.5 nm or less. For example, the average thickness of the adhesion layer can be in a range of about 1 nm to about 2 nm.

In some embodiments, the adhesion layer can have a somewhat greater thickness, such as having an average thickness in a range of about 4 nm or less, and the process flow includes intermixing the catalyst layer and the adhesion layer such that the material of the catalyst layer at least partially extends into or is incorporated within a region of the adhesion layer, the material of the adhesion layer at least partially extends into or is incorporated within a region of the catalyst layer, or both. For example, intermixing can be attained subsequent to deposition of the catalyst layer by inducing material inter-diffusion through application of plasma treatment or thermal treatment (e.g., a temperature in a range of about 400° C. to about 1000° C., about 600° C. to about 1000° C., or about 700° C. to about 900° C.) in a reducing atmosphere (e.g., oxygen-deficient atmosphere), such hydrogen gas or hydrogen plasma, or under vacuum conditions. Such post- or ex situ-treatment in a reducing atmosphere or under vacuum can introduce vacancies (e.g., oxygen vacancies) in the adhesion layer and promote diffusion of Pt or other PGM atoms in the catalyst layer to occupy the vacancies. As another example, intermixing can be attained as part of atomic layer deposition of the catalyst layer and the adhesion layer, where atomic layer deposition cycles to deposit the material of the catalyst layer are interspersed with atomic layer deposition cycles to deposit the material of the adhesion layer. In addition, intermixing or diffusion of Pt or other PGM atoms can be attained by performing electrochemical activation subsequent to deposition. As a result of intermixing, the material of the catalyst layer can be partially incorporated within the adhesion layer to generate a concentration gradient of the material of the catalyst layer over a thickness of the adhesion layer, thereby forming a conductive bridge between the catalyst layer and the substrate. For example, an atomic concentration of Pt or another PGM within the adhesion layer can be non-uniform over the thickness of the adhesion layer, and can vary from a value at an interface or a boundary between the catalyst layer and the adhesion layer along a direction extending away from the interface and into the adhesion layer, such as in a monotonic or other manner. In some embodiments and as a result of intermixing, the material of the catalyst layer can react and form an alloy with the material of the adhesion layer. For example, Pt atoms (or atoms of another PGM or another metal) incorporated within the adhesion layer can form bonds with atoms of a metal element of the adhesion layer to form an alloy or a metal/ceramic composite within a region of the adhesion layer. For the specific case of Pt, Pt can form an alloy with a metal element M of the adhesion layer to form a Pt-M alloy, such as a platinum-titanium alloy. An atomic concentration of Pt within the alloy can be about 50% or greater and up to about 75% or greater. For example, a Pt-M alloy can include $Pt_3Ti$.

To further mitigate against ohmic loss, an electrical conductivity of the adhesion layer can be increased by introducing defects into the adhesion layer. In case of titanium dioxide ($TiO_2$), for example, defects can include oxygen vacancies, dopants introduced at cation sites or anion sites to enhance electrical conductivity, or combinations of two or more of the foregoing. Examples of cation dopants include niobium, tantalum, vanadium, nickel, cobalt, ruthenium, manganese, tungsten, molybdenum, and chromium, and examples of anion dopants include nitrogen, carbon, and fluorine. In case of oxygen vacancies, for example, a defect concentration can be greater than x=about 12.5% in $TiO_2$. In case of niobium, for example, a dopant concentration can be about 5.5% (atomic percent) or greater (see Example section—FIG. 11). Introduction of defects can be attained subsequent to deposition of the adhesion layer through application of plasma treatment or thermal treatment in a reducing atmosphere, such hydrogen gas or hydrogen plasma, or under vacuum conditions, or can be attained as part of atomic layer deposition of the adhesion layer. A resulting defect concentration can have a concentration gradient over a thickness of the adhesion layer.

In some embodiments, the process flow includes optionally functionalizing the adhesion layer to yield a functionalized adhesion layer, followed by deposition of the catalyst layer on the functionalized adhesion layer. Functionalizing the adhesion layer can be similarly performed as explained above for FIG. 1A.

Next, deposition of the catalyst layer on the adhesion layer-coated substrate is performed by chemical vapor deposition and, in particular, atomic layer deposition to yield a catalyst-coated substrate. Depositing the catalyst layer can be similarly performed as explained above for FIG. 1A. Optionally in some embodiments, a passivation gas is introduced to tune or change an adsorption energy between a precursor of the catalyst layer and an already-deposited material to render that adsorption energy less favorable such that subsequent adsorption of the precursor will be preferential or promoted towards covering vacant areas instead of the already-deposited material. A surface coverage of the adhesion layer by the catalyst layer can be partial or incomplete, or can be substantially complete. Desired surface coverage of the catalyst layer can be attained through control over process conditions of atomic layer deposition, including control over a number of atomic layer deposition cycles or an amount of the material of the catalyst layer that is deposited. The resulting catalyst layer can be in the form of a substantially continuous, conformal film, or a non-continuous, conformal film, such as having gaps or openings exposing the underlying adhesion layer, or in the form of discrete regions that are spaced apart from one another to expose the underlying adhesion layer. For example, the catalyst layer generally can provide a surface coverage of the adhesion layer in a range of 0% to about 100% and, more particularly, can provide a surface coverage of the adhesion layer of at least about 30%, such as at least about 40%, at least about 50%, at least about 60%, at least about 70%, at least about 80%, at least about 90%, at least about 95%, at least about 98%, at least about 98.5%, or at least about 99%, and up to about 100%. Surface coverage can be assessed using TEM or SEM imaging techniques, Rutherford backscattering spectroscopy, XPS, AFM, or ICP-MS.

In some embodiments, the adhesion layer provides an increase in catalytic activity through SMSI (e.g., lattice strain effect), and the catalyst layer deposited on the adhesion layer-coated substrate is subjected to thermal treatment in a reducing atmosphere (e.g., oxygen-deficient atmosphere), such hydrogen gas or hydrogen plasma. Such post-treatment or post-annealing in a reducing atmosphere can induce a phase transformation of the adhesion layer (e.g., crystallization), which imparts a lattice strain (e.g., a compressive strain) onto the catalyst layer, and where the lattice strain is maintained or reinforced upon subsequent cooling of the adhesion layer. To induce a phase transformation, a temperature of the catalyst-coated substrate can be increased to about 600° C. or greater, about 650° C. or greater, about 700° C. or greater, about 750° C. or greater, or about 800° C. or greater, and up to about 900° C. or greater. Benefits of a reducing atmosphere include mitigating against oxidation of the adhesion layer while maintaining strong bonding of the adhesion layer to the underlying substrate and the overlying catalyst layer, and mitigating against oxidation of the underlying substrate. For example, in the case of titanium dioxide ($TiO_2$) as a material of the adhesion layer, the material as initially deposited can be, or can include, an amorphous phase, and an increase in temperature can induce a transformation from the amorphous phase to a crystalline phase, namely an anatase phase, and a further increase in temperature can induce a transformation from the anatase phase to a different crystalline phase, namely a rutile phase. $TiO_2$ can remain in the rutile phase upon subsequent cooling of the adhesion layer. The rutile phase of $TiO_2$ can have lattice parameters that are mismatched relative to those of the overlying catalyst layer, and this mismatch in lattice parameters can be maintained or reinforced upon subsequent cooling of the adhesion layer, in view of differences in temperature dependence of lattice parameters of the adhesion layer and the catalyst layer. In turn, this mismatch in lattice parameters can impart a lattice strain onto the catalyst layer to yield an increase in catalytic activity. A reduced thickness of the catalyst layer can promote enhancement of catalytic activity by allowing greater transmission of the imparted lattice strain across a greater fraction of the catalyst layer. The lattice strain can be characterized as a variation of lattice parameters of the catalyst layer (in terms of absolute value), normalized over equilibrium values of the lattice parameters in the absence of strain, where the lattice strain for at least one, or each, lattice parameter can be about 1% or greater, about 2% or greater, about 3% or greater, about 4% or greater, about 5% or greater, or about 8% or greater, and up to about 10% or greater. Variation of lattice parameters can be assessed by X-ray absorption (XAS). An increase in catalytic activity can be attained by applying post-treatment or post-annealing on other materials for the adhesion layer, such as niobium oxide ($Nb_2O_5$) as well as other binary, ternary, quaternary, or higher order oxides.

Next, referring to FIG. 2A, the process flow includes optionally depositing an over-layer (or a protective or capping layer) on the catalyst-coated substrate. Depositing the over-layer can be similarly performed as explained above for FIG. 1A.

In some embodiments, the process flow includes optionally intermixing the catalyst layer and the over-layer such that the material of the catalyst layer at least partially extends into or is incorporated within a region of the over-layer, the material of the over-layer at least partially extends into or is incorporated within a region of the catalyst layer, or both.

In some embodiments, the process flow includes optionally functionalizing the catalyst layer to yield a functionalized catalyst layer, followed by deposition of the over-layer on the functionalized catalyst layer. Functionalizing the catalyst layer can be similarly performed as explained above for FIG. 1A.

Figure 2B:
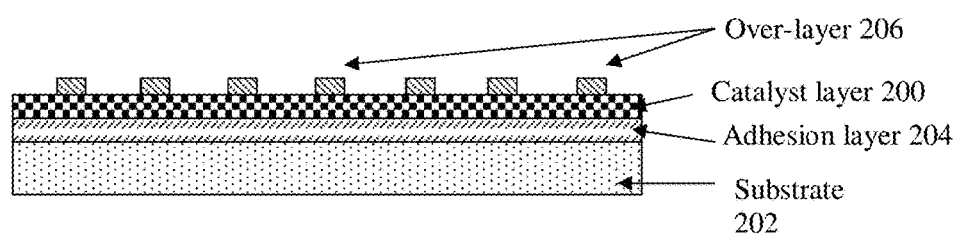
FIG. 2B. Schematic illustration of an example of a resulting structure from the process flow of FIG. 2A, in which a set of deposited layers including a catalyst layer covers a substrate.

FIG. 2B is a schematic illustration of an example of a resulting structure from the process flow of FIG. 2A, in which a set of deposited layers including a catalyst layer 200 covers a substrate 202. As shown, an adhesion layer 204 is in the form of a substantially continuous film, and a surface coverage of the substrate 202 by the adhesion layer 204 is substantially complete. Also, the catalyst layer 200 is in the form of a substantially continuous film, and a surface coverage of the adhesion layer 204 by the catalyst layer 200 is substantially complete. The adhesion layer 204 has a reduced thickness of about 2 nm or less or about 1 nm or less, such that enhanced activity and stability are rendered to the catalyst layer 200 by the adhesion layer 204, while the reduced thickness shortens an electrical pathway distance between the catalyst layer 200 and the substrate 202, thereby mitigating against ohmic loss. A surface coverage of the catalyst layer 200 by an over-layer 206 is partial or incomplete, such that enhanced stability is rendered to the catalyst layer 200 by the over-layer 206 while maintaining sufficient exposure of catalytically active sites. Both the adhesion layer 204 and the over-layer 206 render stability to the catalyst layer 200, which is encapsulated by the adhesion layer 204 and the over-layer 206.

Figure 2C:
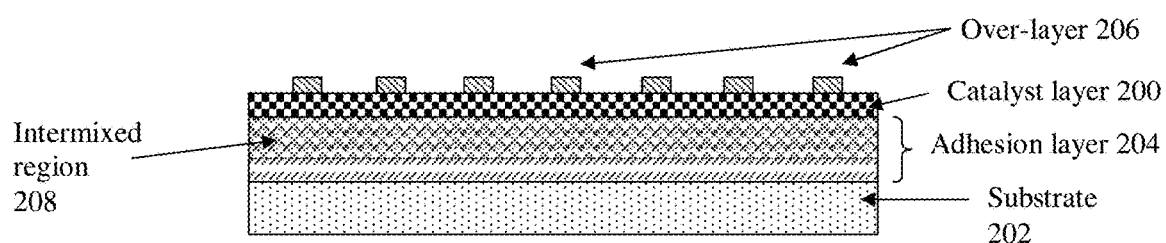
FIG. 2C. Schematic illustration of another example of a resulting structure from the process flow of FIG. 2A, in which a set of deposited layers including a catalyst layer covers a substrate.

FIG. 2C is a schematic illustration of another example of a resulting structure from the process flow of FIG. 2A, in which a set of deposited layers including a catalyst layer 200 covers a substrate 202. As shown, an adhesion layer 204 is in the form of a substantially continuous film, and a surface coverage of the substrate 202 by the adhesion layer 204 is substantially complete. Also, the catalyst layer 200 is in the form of a substantially continuous film, and a surface coverage of the adhesion layer 204 by the catalyst layer 200 is substantially complete. The adhesion layer 204 has a thickness of in a range of about 4 nm or less, and the catalyst layer 200 and the adhesion layer 204 are intermixed such that the material of the catalyst layer 200 at least partially extends into or is incorporated within a region of the adhesion layer 204. As a result of intermixing, the material of the catalyst layer 200 is partially incorporated within the adhesion layer 204 to generate a concentration gradient of the material of the catalyst layer 200 over a thickness of the adhesion layer 204 in an intermixed region 208. In such manner, enhanced activity and stability are rendered to the catalyst layer 200 by the adhesion layer 204, while the concentration gradient shortens an electrical pathway distance between the incorporated material of the catalyst layer 200 and the substrate 202, thereby mitigating against ohmic loss. As shown in FIG. 2C, a distance between an end point of the concentration gradient (e.g., where a concentration of the incorporated material of the catalyst layer 200 falls to zero or below a detectable level) is a range of about 1 nm or less, although the concentration gradient may extend to reach and provide direct contact with the substrate 202. A surface coverage of the catalyst layer 200 by an over-layer 206 is partial or incomplete, such that enhanced stability is rendered to the catalyst layer 200 by the over-layer 206 while maintaining sufficient exposure of catalytically active sites. Both the adhesion layer 204 and the over-layer 206 render stability to the catalyst layer 200, which is encapsulated by the adhesion layer 204 and the over-layer 206. The catalyst layer 200 and the over-layer 206 also can be intermixed such that the material of the catalyst layer 200 at least partially extends into or is incorporated within a region of the over-layer 206, the material of the over-layer 206 at least partially extends into or is incorporated within a region of the catalyst layer 200, or both.

Figure 2D:
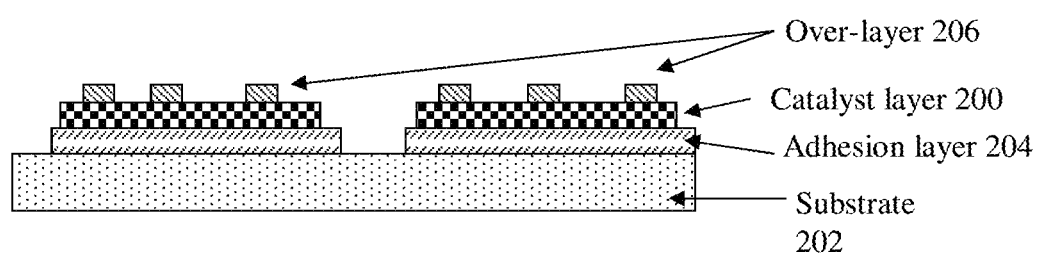
FIG. 2D. Schematic illustration of another example of a resulting structure from the process flow of FIG. 2A, in which a set of deposited layers including a catalyst layer covers a substrate.

FIG. 2D is a schematic illustration of another example of a resulting structure from the process flow of FIG. 2A, in which a set of deposited layers including a catalyst layer 200 covers a substrate 202. As shown, an adhesion layer 204 is in the form of a non-continuous film, and a surface coverage of the substrate 202 by the adhesion layer 204 is partial or incomplete. Also, the catalyst layer 200 is in the form of a non-continuous film, and a surface coverage of the adhesion layer 204 by the catalyst layer 200 is partial or incomplete, with portions of the adhesion layer 204 remaining uncovered or exposed from the catalyst layer 200. It is also contemplated that a surface coverage of the adhesion layer 204 by the catalyst layer 200 can be substantially complete, or that the catalyst layer 200 can extend beyond the adhesion layer 204 to reach and be in direct contact with the substrate 202. The adhesion layer 204 has a reduced thickness of about 2 nm or less or about 1 nm or less, such that enhanced activity and stability are rendered to the catalyst layer 200 by the adhesion layer 204, while the reduced thickness shortens an electrical pathway distance between the catalyst layer 200 and the substrate 202, thereby mitigating against ohmic loss. It is also contemplated that intermixing can occur such that the material of the catalyst layer 200 at least partially extends into or is incorporated within the adhesion layer 204. A surface coverage of the catalyst layer 200 by an over-layer 206 is partial or incomplete, such that enhanced stability is rendered to the catalyst layer 200 by the over-layer 206 while maintaining sufficient exposure of catalytically active sites. Both the adhesion layer 204 and the over-layer 206 render stability to the catalyst layer 200, which is encapsulated by the adhesion layer 204 and the over-layer 206.

Electrochemical Catalysts with Enhanced Catalytic Activity Through Template Effect:

Some embodiments of this disclosure are directed to an improved process of forming highly active and ultra-low loading catalysts, as well as resulting structures of the catalysts. Through the use of a template layer deposited on a substrate, a catalyst can be initially deposited on the template layer-coated substrate. Upon at least partial removal of the template layer, a strain can be imparted onto the catalyst, thereby imparting an increase in catalytic activity through structural (e.g., lattice strain) effects.

Figure 3A:
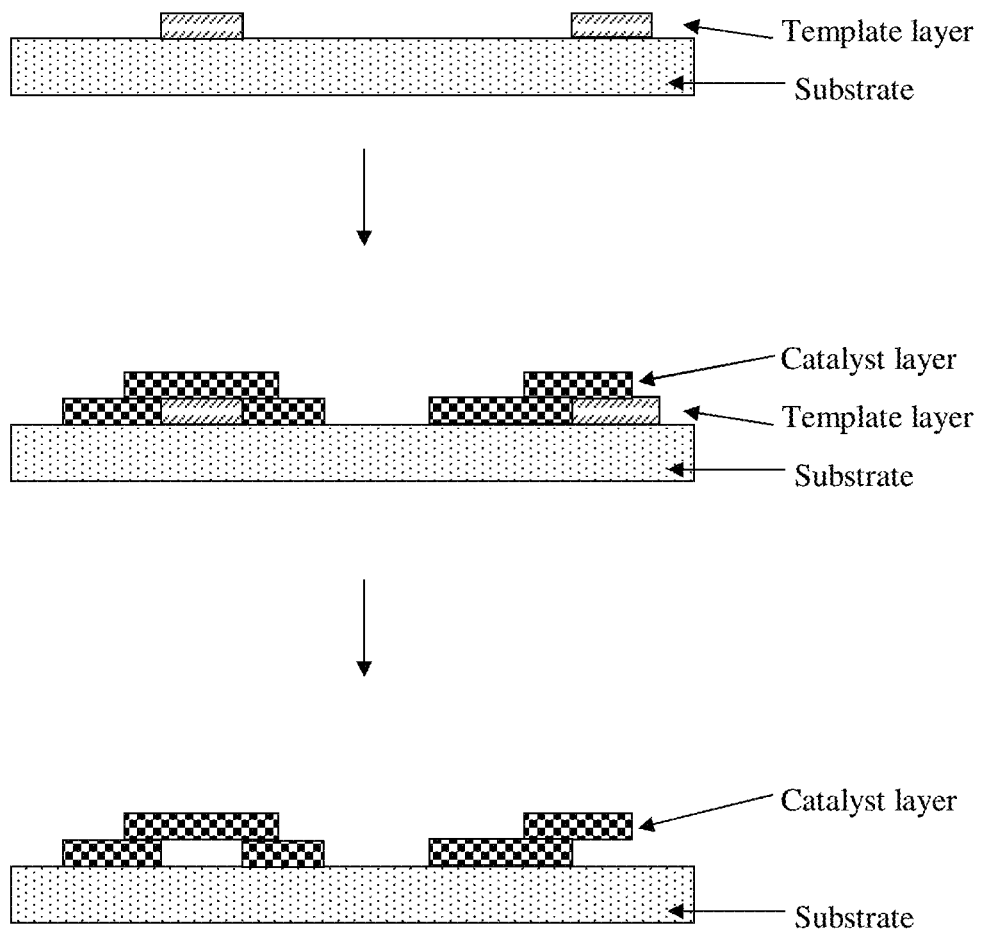
FIG. 3A. Schematic process flow of forming a thin film of a catalyst on a substrate.

FIG. 3A is a schematic process flow of forming a thin film of a catalyst on a substrate. Certain aspects of the process flow in FIG. 3A can be similarly performed as explained above for FIG. 1A and FIG. 2A, and those aspects are not repeated.

Referring to FIG. 3A, the process flow includes optionally functionalizing the substrate to yield a functionalized substrate. Functionalizing the substrate can be similarly performed as explained above for FIG. 1A.

Next, the process flow includes depositing an adhesion layer as a template layer on the functionalized substrate to yield a template layer-coated substrate. The template layer can promote a faster growth rate of a subsequently deposited catalyst layer, leading to an accelerated growth of the catalyst layer on the template layer compared to direct growth on the substrate. Examples of a material of the template layer include those explained above for an over-layer, including metal or metalloid oxides. Particular examples include cobalt oxide ($CoO_x$), nickel oxide ($NiO_x$), and cerium oxide ($CeO_x$). Depositing the template layer is performed by chemical vapor deposition and, in particular, atomic layer deposition. Desired thickness and surface coverage of the template layer can be attained through control over process conditions of atomic layer deposition, including control over a number of atomic layer deposition cycles or an amount of the material of the template layer that is deposited. As shown in FIG. 3A, the resulting template layer is in the form of a non-continuous, conformal film, such as in the form of discrete regions (e.g., discrete deposits) that are spaced apart from one another to expose the underlying substrate. For example, the template layer can provide a surface coverage of the substrate in a range of up to about 80%, up to about 70%, up to about 60%, or up to about 50%, and down to about 40% or less, or down to about 30% or less. Surface coverage can be assessed using TEM or SEM imaging techniques, Rutherford backscattering spectroscopy, XPS, AFM, or ICP-MS. In some embodiments, an average thickness of the template layer can be in a range of about 3 nm or less, about 2.5 nm or less, about 2 nm or less, about 1.5 nm or less, or about 1 nm or less, and down to about 0.5 nm or less. For example, the average thickness of the template layer can be in a range of up to about 1.5 nm. An average lateral size of the discrete regions of the template layer can be about 20 nm or less, such as about 15 nm or less, about 10 nm or less, about 8 nm or less, about 5 nm or less, about 4 nm or less, or about 3 nm or less, and down to about 0.3 nm or less. A size of a region corresponds to a diameter of a smallest corresponding circle within which the region can be fully surrounded, and can be assessed using imaging techniques, such as using TEM or SEM images.

In some embodiments, the process flow includes optionally functionalizing the template layer to yield a functionalized template layer, followed by deposition of the catalyst layer on the functionalized template layer. Functionalizing the template layer can be similarly performed as explained above for FIG. 1A.

Next, deposition of the catalyst layer on the template layer-coated substrate is performed by chemical vapor deposition and, in particular, atomic layer deposition to yield a catalyst-coated substrate. Depositing the catalyst layer can be similarly performed as explained above for FIG. 1A. A surface coverage of the substrate by the catalyst layer can be partial or incomplete, or can be substantially complete. Desired surface coverage of the catalyst layer can be attained through control over process conditions of atomic layer deposition, including control over a number of atomic layer deposition cycles or an amount of a material of the catalyst layer that is deposited. As shown in FIG. 3A, the resulting catalyst layer is in the form of a non-continuous, conformal film, such as in the form of discrete regions (e.g., discrete deposits) that are spaced apart from one another to expose the underlying template layer and the substrate. For example, the catalyst layer can provide a surface coverage of the substrate in a range of up to about 90%, up to about 80%, up to about 70%, or up to about 60%, and down to about 50% or less, or down to about 40% or less. Surface coverage can be assessed using TEM or SEM imaging techniques, Rutherford backscattering spectroscopy, XPS, AFM, or ICP-MS. In some embodiments, an average thickness of the catalyst layer can be in a range of about 8 nm or less, about 7 nm or less, about 6 nm or less, about 5 nm or less, or about 4 nm or less, and down to about 1 nm or less. For example, the average thickness of the catalyst layer can be in a range of about 1 nm to about 4 nm. An average lateral size of the discrete regions of the catalyst layer can be about 20 nm or less, such as about 15 nm or less, about 10 nm or less, about 8 nm or less, about 5 nm or less, about 4 nm or less, or about 3 nm or less, and down to about 1 nm or less. A size of a region corresponds to a diameter of a smallest corresponding circle within which the region can be fully surrounded, and can be assessed using imaging techniques, such as using TEM or SEM images. As shown in FIG. 3A, each region of various regions the catalyst layer includes a portion that is bonded (e.g., directly bonded or contacting) to the substrate, and another portion that is bonded (e.g., directly bonded or contacting) to a region of the template layer that is interposed between the region of the catalyst layer and the substrate.

Next, the process flow includes at least partially removing the template layer. In particular, the template layer is selectively or preferentially removed relative to the catalyst layer, so as to largely or substantially retain the catalyst layer on the substrate. Removal of the template layer can be performed by wet chemical treatment, such as by immersing or otherwise exposing to a solution in which the material of the template layer has a greater solubility than the material of the catalyst layer, thereby dissolving or leaching the material of the template layer. A difference in solubility between the material of the template layer and the material of the catalyst layer can be by a factor of about 1.5 times or greater, about 2 times or greater, about 3 times or greater, or about 5 times or greater, and up to about 10 times or greater. The solution for removal of the template layer can include an acid or another reactive compound. Removal of the template layer also can be performed by another technique, such as by thermal treatment.

As shown in FIG. 3A subsequent to removal of the template layer, each region of various regions of the catalyst layer includes at least one portion that is bonded (e.g., directly bonded or contacting) to the substrate, and at least another portion that extends over the substrate and is spaced apart from the substrate by a gap or a void, where the gap correspond to a region of the template layer that was previously interposed between the region of the catalyst layer and the substrate. Such gap can impart a lattice strain onto the region of the catalyst layer, and where the lattice strain can result from, for example, deformation of the region of the catalyst layer to accommodate the presence of the gap and a structural constraint imposed by bonding between the region of the catalyst layer and the substrate. A reduced thickness of the catalyst layer can promote enhancement of catalytic activity by allowing greater transmission of the imparted lattice strain across a greater fraction of the catalyst layer. The lattice strain can be characterized as a variation of lattice parameters of the catalyst layer (in terms of absolute value), normalized over equilibrium values of the lattice parameters in the absence of strain, where the lattice strain for at least one, or each, lattice parameter can be about 1% or greater, about 2% or greater, about 3% or greater, about 4% or greater, about 5% or greater, or about 8% or greater, and up to about 10% or greater. Variation of lattice parameters can be assessed by XAS.

Figure 3B:
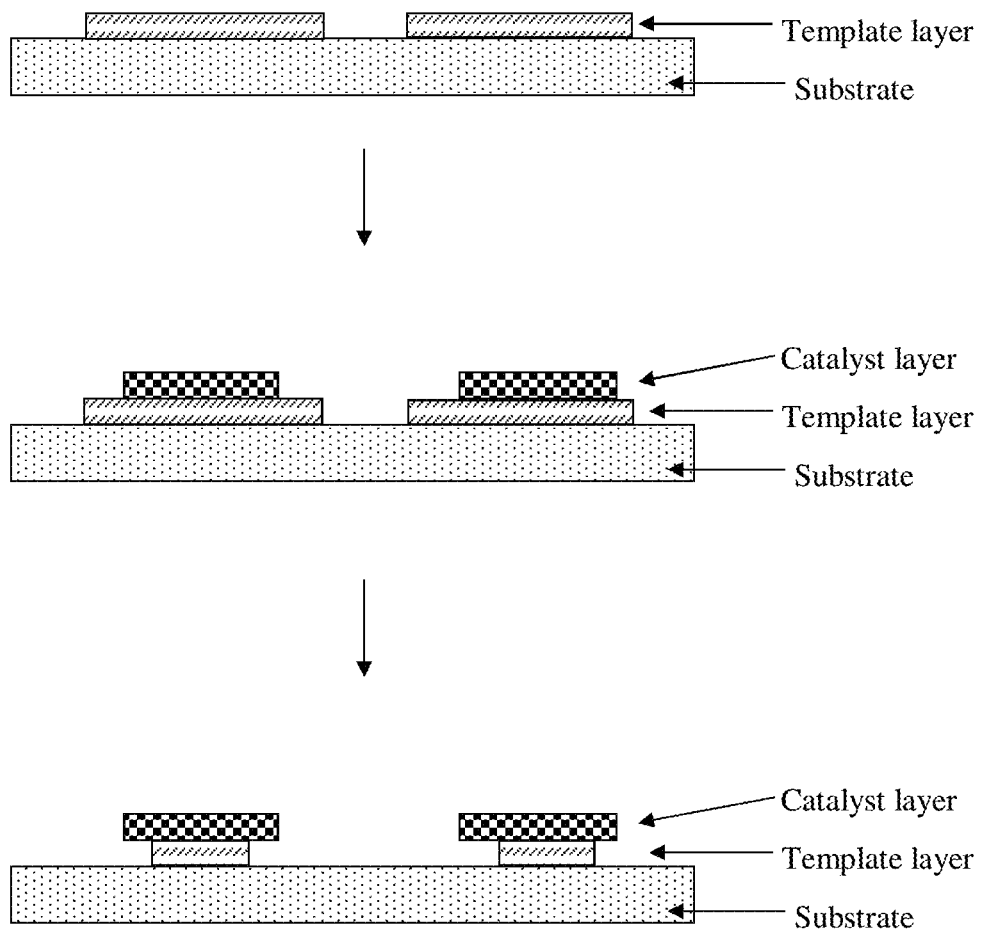
FIG. 3B. Schematic process flow of forming a thin film of a catalyst on a substrate.

Removal of a template layer can be partial or incomplete. FIG. 3B is another schematic process flow of forming a thin film of a catalyst on a substrate. Certain aspects of the process flow in FIG. 3B can be similarly performed as explained above for FIG. 1A, FIG. 2A, and FIG. 3A, and those aspects are not repeated.

Referring to FIG. 3B, the process flow includes optionally functionalizing the substrate to yield a functionalized substrate. Functionalizing the substrate can be similarly performed as explained above for FIG. 1A.

Next, the process flow includes depositing a template layer on the functionalized substrate to yield a template layer-coated substrate. Depositing the template layer can be similarly performed as explained above for FIG. 3A. As shown in FIG. 3B, the resulting template layer is in the form of a non-continuous, conformal film, such as in the form of discrete regions (e.g., discrete deposits) that are spaced apart from one another to expose the underlying substrate.

In some embodiments, the process flow includes optionally functionalizing the template layer to yield a functionalized template layer, followed by deposition of a catalyst layer on the functionalized template layer. Functionalizing the template layer can be similarly performed as explained above for FIG. 1A.

Next, deposition of the catalyst layer on the template layer-coated substrate is performed by chemical vapor deposition and, in particular, atomic layer deposition to yield a catalyst-coated substrate. Depositing the catalyst layer can be similarly performed as explained above for FIG. 1A. As shown in FIG. 3B, the resulting catalyst layer is in the form of a non-continuous, conformal film, such as in the form of discrete regions (e.g., discrete deposits) that are spaced apart from one another to expose the underlying template layer and the substrate. Each region of various regions the catalyst layer is bonded (e.g., directly bonded or contacting) to a region of the template layer that is interposed between the region of the catalyst layer and the substrate.

Next, the process flow includes partially removing the template layer. In particular, the template layer is selectively or preferentially removed relative to the catalyst layer, so as to largely or substantially retain the catalyst layer on the substrate. Partial removal of the template layer can be performed by wet chemical treatment, such as by immersing or otherwise exposing to a solution in which a material of the template layer has a greater solubility than a material of the catalyst layer. Partial removal of the template layer can be attained through control over process conditions of wet chemical treatment, including control over a time duration to which the template layer is exposed to a solution or a composition of the solution.

As shown in FIG. 3B subsequent to partial removal of the template layer, each region of various regions of the catalyst layer includes at least one portion that is bonded (e.g., directly bonded or contacting) to a region of the template layer that is interposed between the region of the catalyst layer and the substrate, and at least another portion that extends over the substrate and is spaced apart from the substrate by a gap or a void, where the gap correspond to a partially removed portion of the interposed region of the template layer. Such gap can impart a lattice strain onto the region of the catalyst layer, and where the lattice strain can result from, for example, deformation of the region of the catalyst layer to accommodate the presence of the gap and a structural constraint imposed by bonding between the region of the catalyst layer and the interposed region of the template layer. A reduced thickness of the catalyst layer can promote enhancement of catalytic activity by allowing greater transmission of the imparted lattice strain across a greater fraction of the catalyst layer. The lattice strain can be characterized as a variation of lattice parameters of the catalyst layer (in terms of absolute value), normalized over equilibrium values of the lattice parameters in the absence of strain, where the lattice strain for at least one, or each, lattice parameter can be about 1% or greater, about 2% or greater, about 3% or greater, about 4% or greater, about 5% or greater, or about 8% or greater, and up to about 10% or greater. Variation of lattice parameters can be assessed by XAS. An exposed lateral surface of the interposed region of the template layer can have a profile that is substantially flat, concave, convex, or another shape.

Figure 4:
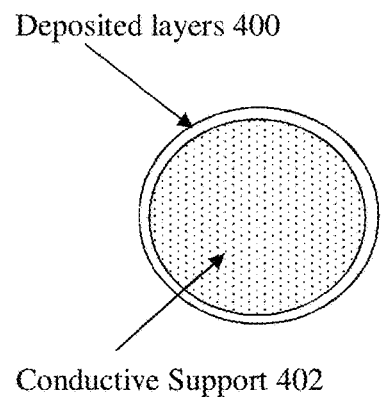
FIG. 4. Schematic illustration of a structure of a supported catalyst, with a set of one or more deposited layers including a catalyst layer covering a conductive support.

Supported Catalysts, Gas Diffusion Layers, and Fuel Cells:

FIG. 4 is a schematic illustration of a structure of a supported catalyst, with a set of one or more deposited layers 400 including a catalyst layer covering a conductive support 402. Here, the conductive support 402 is in the form of a nanoparticle, such as a carbonaceous nanoparticle having a size in a range of about 5 nm to about 500 nm or more, such as from about 10 nm to about 400 nm, from about 10 nm to about 300 nm, from about 10 nm to about 200 nm, from about 10 nm to about 150 nm, or from about 10 nm to about 100 nm, and having an aspect ratio of about 3 or less, or about 2 or less. Other types of conductive supports can be used, such as carbon black, graphitic carbon, carbon nanotubes, carbon nanofibers, carbon microfibers, graphene sheets, other high surface area and conductive forms of carbon, as well as non-carbon-based conductive supports, such as titanium nitride supports and conductive oxide supports. The set of deposited layers 400 can be implemented in a similar manner as explained in the foregoing.

Figure 5:
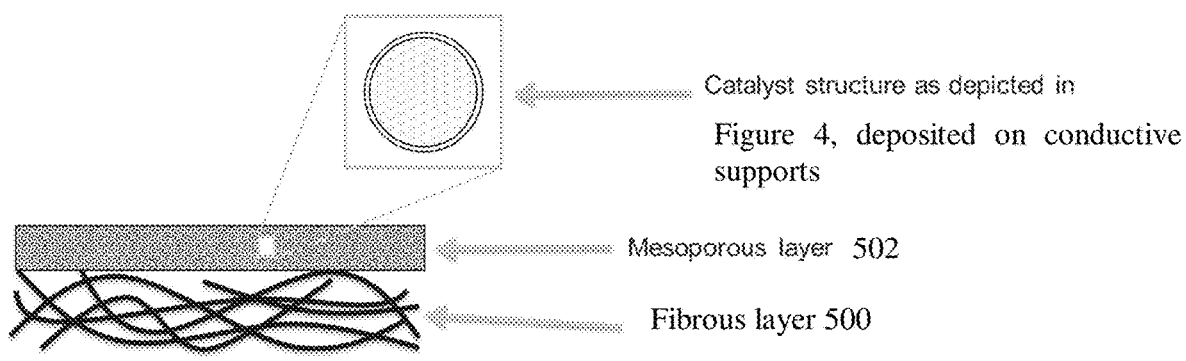
FIG. 5. Schematic illustration of a structure of a gas diffusion layer.

FIG. 5 is a schematic illustration of a structure of a gas diffusion layer, which includes a carbonaceous fibrous layer 500, such as carbon cloth, carbon fibers, or carbon paper, although other carbonaceous or non-carbon-based fibrous materials can be used. The gas diffusion layer also includes a mesoporous layer 502. The carbonaceous fibrous layer 500 can have relatively large pores and can be relatively rough, and is covered by the mesoporous layer 502. The mesoporous layer 502 includes carbonaceous nanoparticles or other conductive supports, a polymeric binder, and a fluorinated polymer, such as polytetrafluoroethylene (PTFE), to control water transport. A pore structure of the mesoporous layer 502 can be considerably finer and smoother compared to the carbonaceous fibrous layer 500, which is desirable for the transport of gases and water, and also protects a polymeric ion-conductive membrane from mechanical punching by fibers of the carbonaceous fibrous layer 500. A catalyst layer is deposited on conductive supports within the mesoporous layer 502, whereby a penetration depth of the catalyst layer can be influenced by atomic layer deposition process conditions.

Various applications of fuel cells can benefit from a structure of a catalyst disclosed herein. Examples include:

1) Fuel cell powered vehicles, such as cars, buses, trucks, and motorcycles;
2) Stationary fuel cell applications; and
3) Fuel cells in consumer electronic products.
4) Nanoscale catalytic systems where reduction of use of precious metals with little or no sacrifice of activity and stability are desired.

Various types of fuel cells can benefit from the structure of the catalyst disclosed herein. Specific examples include hydrogen ($H_2$)—PEM fuel cells, methanol fuels, and ethanol fuel cells, amongst others.

Examples of benefits include:

1) The catalyst structure exhibits an oxygen reduction reaction (ORR) activity of about 0.5 A/mg(Pt) or greater in rotating disk electrode (RDE) measurements;
2) Surface-to-volume enhanced catalyst structure, where atomic layer deposition can be used to deposit ultra-thin layers with high uniformity in thickness in a range of a few nm's or more;
3) Compared to other catalytic systems, the use of atomic layer deposition can improve mass activity (e.g., catalytic activity normalized by an amount of Pt or other PGM) by more than one order of magnitude with significantly lower degradation rate; and
4) The process flow including the use of atomic layer deposition provides a cost-effective and scalable method to fabricate heterogeneous catalysts with little or no sacrifice of activity and stability.

Figure 6:
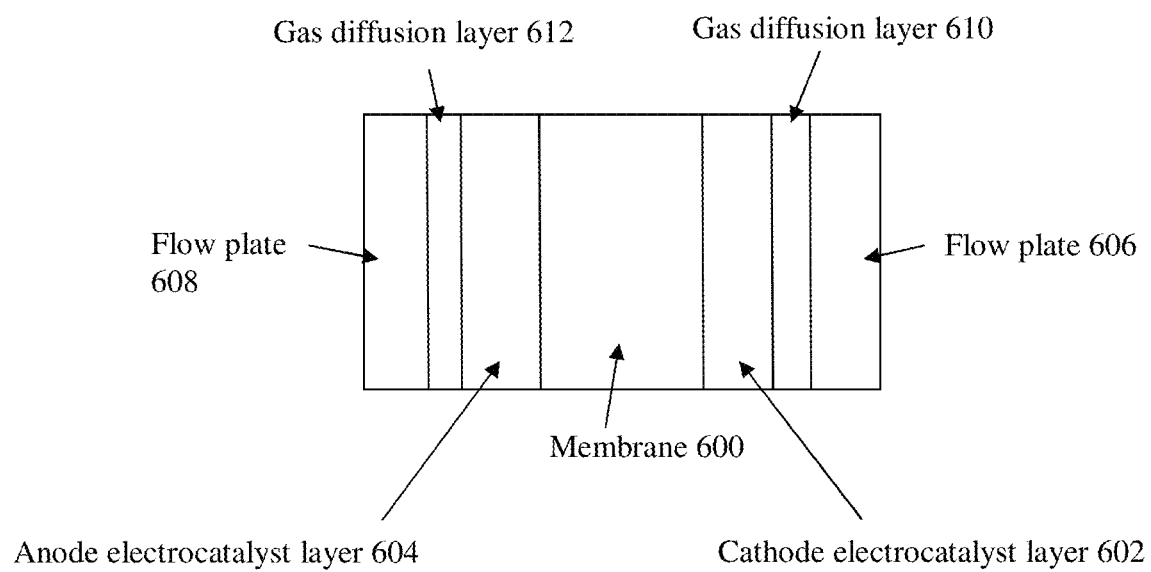
FIG. 6. Schematic illustration of a PEM fuel cell incorporating a supported catalyst disclosed herein.

FIG. 6 is a schematic illustration of a PEM fuel cell incorporating a supported catalyst disclosed herein. The fuel cell includes a polymeric ion-conductive membrane 600 disposed between a cathode electrocatalyst layer 602 and an anode electrocatalyst layer 604, which together constitute a membrane electrode assembly of the fuel cell. The fuel cell also includes electrically conductive flow field plates 606 and 608, which can be bipolar plates or unipolar plates. Gas diffusion layers 610 and 612 are also interposed between the flow field plates 606 and 608 and the electrocatalyst layers 602 and 604. Either of, or both, the cathode electrocatalyst layer 602 and anode electrocatalyst layer 604 can include a supported catalyst disclosed herein. For example, the supported catalyst can promote oxygen reduction reaction at the cathode side when incorporated into the cathode electrocatalyst layer 602, and also can promote hydrogen oxidation reaction at the anode side when incorporated into the anode electrocatalyst layer 604.

Figure 7:
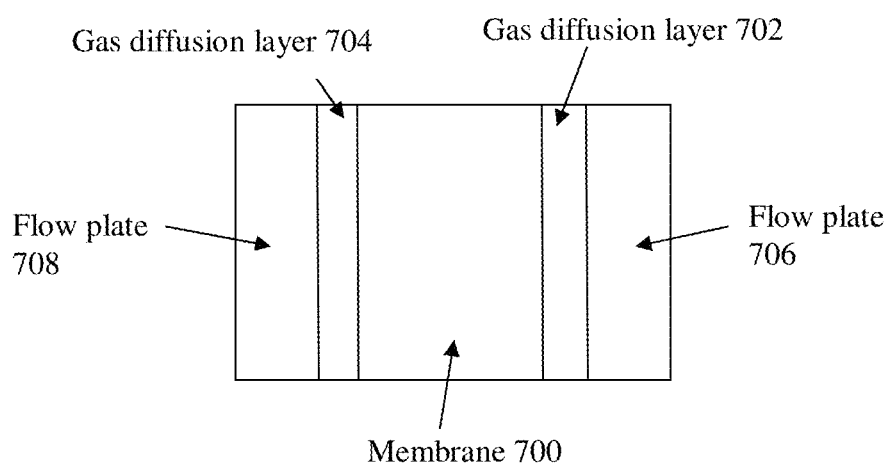
FIG. 7. Schematic illustration of another PEM fuel cell incorporating a structure of a catalyst disclosed herein.

FIG. 7 is a schematic illustration of another PEM fuel cell incorporating a structure of a catalyst disclosed herein. The fuel cell includes a polymeric ion-conductive membrane 700 disposed between gas diffusion layers 702 and 704, which are, in turn, disposed between electrically conductive flow field plates 706 and 708, which can be bipolar plates or unipolar plates. Either of, or both, the gas diffusion layer 702 at the cathode side and the gas diffusion layer 704 at the anode side can include a set of one or more deposited layers including a catalyst layer disclosed herein. For example, the catalyst layer can promote oxygen reduction reaction when incorporated into the gas diffusion layer 702 at the cathode side, and also can promote hydrogen oxidation reaction when incorporated into the gas diffusion layer 704 at the anode side. By directly forming a thin film of a catalyst on a gas diffusion layer, an additional layer including a catalyst support can be omitted.

EXAMPLES

The following examples describe specific aspects of some embodiments of this disclosure to illustrate and provide a description for those of ordinary skill in the art. The examples should not be construed as limiting this disclosure, as the examples merely provide specific methodology useful in understanding and practicing some embodiments of this disclosure.

Example 1

Atomic Layer Deposition (ALD)

ALDs of platinum (Pt) and oxide films (e.g., $Nb_2O_5$, $TiO_2$, $Al_2O_3$, and $SiO_2$) were performed in a FlexAL (Oxford Instruments) hot wall reactor equipped with a remote inductively coupled plasma (ICP) generator which was operated at about 300 W at about 13.56 MHz. The corresponding precursors for the films are trimethyl(methylcyclopentadienyl)platinum(IV) ($MeCpPtMe_3$), niobium (V) ethoxide, tetrakis(dimethylamido)titanium (TDMAT), trimethylaluminum (TMA), and tris[dimethylamino]silane (3DMAS). Oxygen plasma generated by the ICP generator was used as a co-reactant. A substrate temperature was about 250° C. By adjusting dosing times for precursors during the ALD process, a chamber pressure was sustained above about 20 mTorr.

The following provides example process conditions for plasma-enhanced ALD (PEALD) of $TiO_2$:

Growth rate of $TiO_2$=about 0.5 Å/cycle

PEALD conditions

Substrate temperature at about 250° C.

Ti-containing precursor=TDMAT at >about 45° C.

The following provides example process conditions for PEALD of Pt:
Growth rate of Pt=about 0.5 Å/cycle
PEALD conditions
  Substrate temperature at about 250° C.
  Pt-containing precursor=MeCpPtMe$_3$ at >about 45° C.
The following provides an example of a process flow for forming a metal/ceramic matrix composite catalyst:
1. Plasma treatment to form functional groups on a conductive substrate (e.g., 0$_2$ or H$_2$ plasma, or both)
2. ALD of a metal oxide to form an adhesion layer (or an under-layer)
   option 1) TiO$_2$ adhesion layer with a thickness of 0 to about 1 nm through ALD (e.g., thermal ALD, ozone ALD, or PEALD). In the case of PEALD of TiO$_2$ at about 250° C., 0 to 20 cycles are performed to achieve the aforementioned thickness.
   option 2) TiO$_2$ adhesion layer with a thickness of 0 to about 4 nm through ALD. After deposition of Pt, hydrogen thermal treatment at >about 200° C. or hydrogen plasma treatment is performed to incorporate Pt into the TiO$_2$ matrix.
3. ALD of one or more metals (e.g., Pt or other PGM; pure metal or alloys) to form a catalyst layer
   Pt layer with a thickness of 0 to about 4 nm through PEALD. In the case of PEALD of Pt at about 250° C., 0 to 80 cycles are performed to achieve the aforementioned thickness.
4. (optional) ALD of a metal oxide to from an over-layer (or a protective or capping layer)
   In the case of PEALD of TiO$_2$ at about 250° C., 0 to 20 cycles are performed to achieve a thickness of 0 to about 1 nm.

Activity Measurements Using Rotating Disk Electrode (RDE)

ALD-film-coated glassy carbon (GC) disks with a diameter of about 5 mm were used for electrochemical measurements of kinetic current densities ($i_k$) and accelerated-durability-tests (ADTs). A disk was assembled on a RDE tip for activity evaluation. An electrolyte was diluted from about 70% perchloric acid (Vertias Doubly Distilled, GES chemicals) to about 0.1 mol/L with ultrapure water (about 18.2 MΩ·cm, Total organic carbon (TOC)<about 5 ppb). A three-electrode cell with a platinum wire as a counter electrode and a reversible hydrogen electrode (RHE) as a reference electrode was used. During oxygen reduction reaction (ORR) measurements, a pressure of oxygen was balanced by atmospheric pressure. The measurement temperature was 23±2° C. To reduce contaminants, all glassware was soaked in piranha solution for more than about 24 hours, and rinsed 5 times with ultrapure water prior to use. Before measuring their $i_k$ values, the catalyst-coated GC disks underwent an activation process in argon gas-purged electrolyte with cyclic voltammetry (CV) from about 0.025 V to about 1.4 V for about 100 cycles at a scan rate of about 500 mV/s. The $i_k$ values were evaluated by a linear sweep voltammetry (LSV) at varied scan rates (about 5-100 mV/s) from about −0.01 V to about 1 V under different electrode rotation rates. For ADTs, CV from about 0.6 V to about 1 V for about 10,000 cycles was conducted with a scan rate of about 100 mV/sec. During the $i_k$ measurements and the ADTs, the RDE tips were rotated with a speed of about 1600 rpm.

Figure 8:
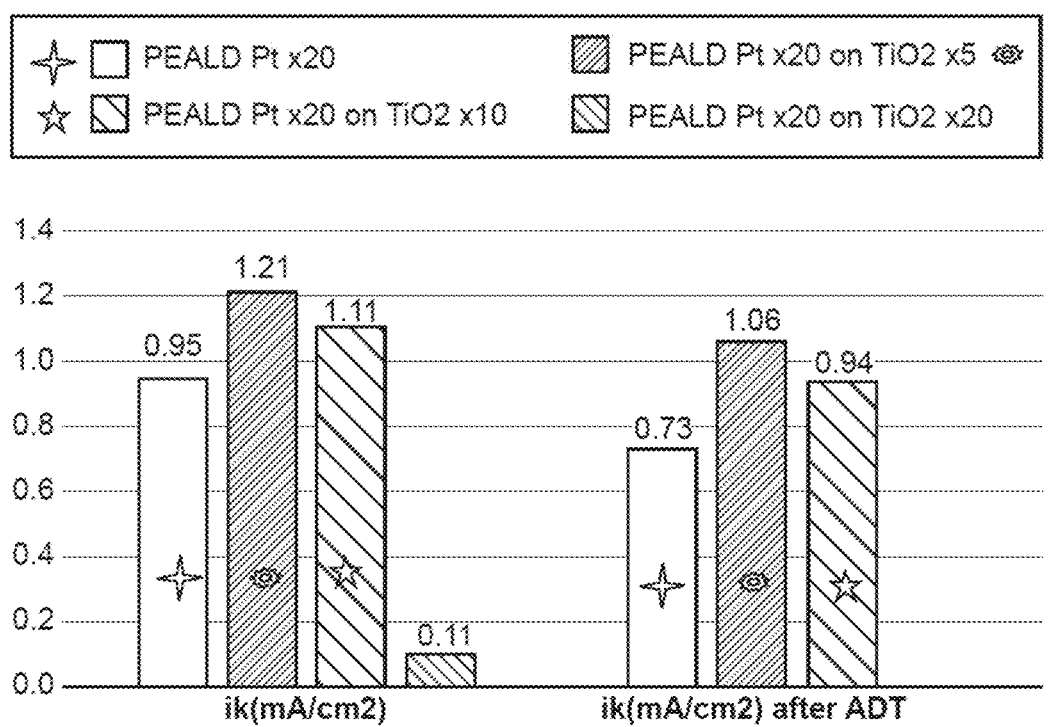
FIG. 8. Kinetic current densities ($i_k$) before and after accelerated-durability-tests for four different catalytic systems.

FIG. 8 shows kinetic current densities ($i_k$) before and after the ADTs for four different catalytic systems: PEALD Pt 20 cycles on TiO$_2$ adhesion layer with different PEALD TiO$_2$ cycles of x, x=0, 5, 10, and 20, corresponding thickness values of 0, about 0.3 nm, about 0.7 nm, and about 1.5 nm, respectively. The value, $i_k$, is an indication of catalytic performance while the change in $i_k$ before and after the ADTs representing a stability of catalysts. The catalytic configuration, Pt/TiO$_2$/GC, shows higher stability, namely a lower change in $i_k$, about −13% and about −15% for Pt×20 on TiO$_2$×5 and Pt×20 on TiO$_2$×10, respectively, than the Pt/GC with the $i_k$ change of about −23%. However, if the thickness of the underlying TiO$_2$ exceeds about 1 nm, the initial $i_k$ value significantly declines (e.g., about 0.11 mA/cm$^2$) and further ADT analysis was not conducted on this case.

X-Ray Photoelectron Spectroscopy (XPS) and Platinum Atomic Composition Measurement XPS and platinum atomic composition measurement was carried out by XPS (PHI VersaProbe Scanning XPS Microscope).

Figure 9:
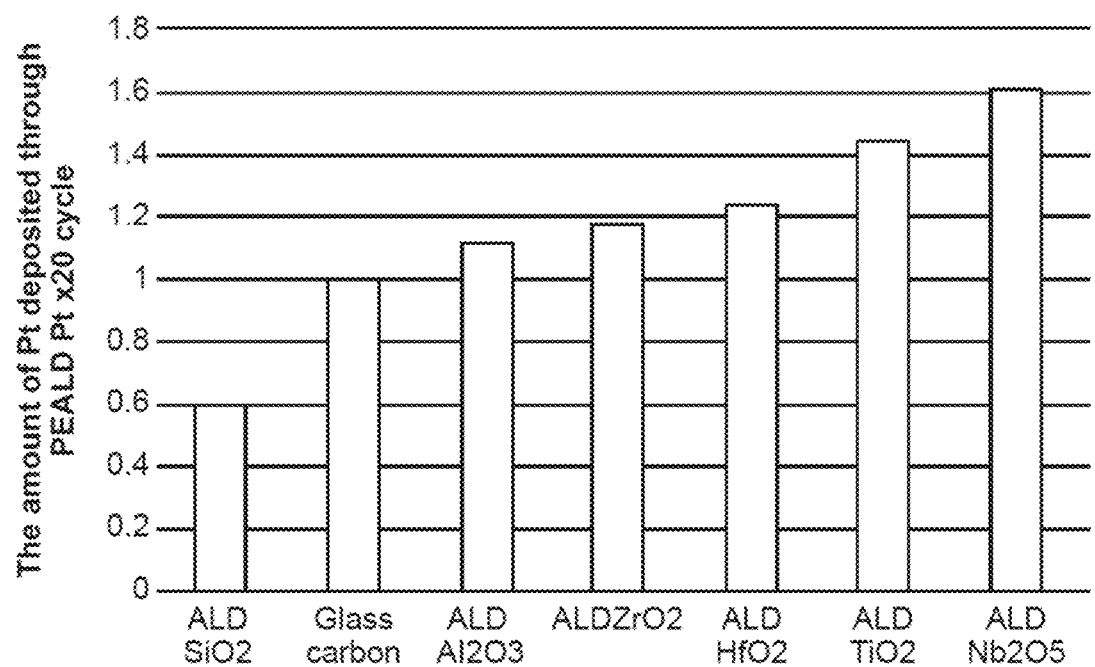
FIG. 9. Amounts of platinum deposited on substrates with different adhesion layers ($Nb_2O_5$, $TiO_2$, $HfO_2$, $ZrO_2$, $Al_2O_3$, and $SiO_2$) up through a cycle number of 20, normalized by an amount of platinum deposited on glassy carbon.

FIG. 9 shows amounts of Pt deposited on substrates with different adhesion layers (Nb$_2$O$_5$, TiO$_2$, HfO$_2$, ZrO$_2$, Al$_2$O$_3$, and SiO$_2$) through PEALD for Pt up through a cycle number of 20, normalized by an amount of Pt deposited on glassy carbon.

Atomic Force Microscopy (AFM)

AFM imaging was performed in a contact-mode using an Agilent 5500 microscope (Agilent Technologies, Santa Clara, CA) equipped with a silicon tip with aluminum reflex coating (Tap300AL-G, Ted Pella) with a nominal radius of <about 10 nm and a piezoelectric scanner (about 11×11 µm$^2$) fitted to an infrared laser source, placed inside a custom-made vibration isolation chamber. A scanning analysis area is about 0.5 µm×about 0.5 µm.

Figure 10:
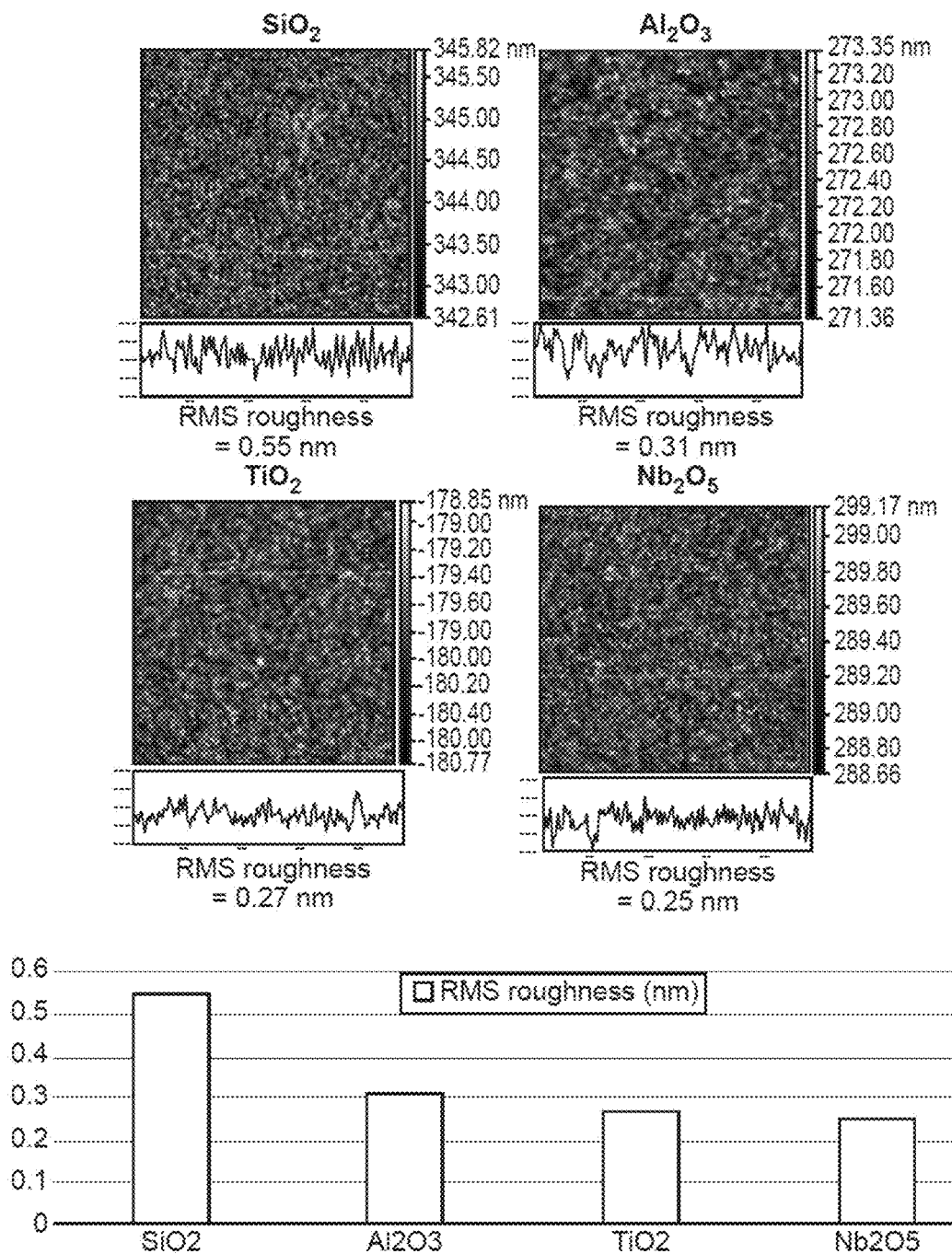
FIG. 10. Surface roughness (root-mean-square (rms)) of platinum deposited on substrates with different adhesion layers ($SiO_2$, $Al_2O_3$, $TiO_2$, and $Nb_2O_5$) up through a cycle number of 20.

FIG. 10 shows surface roughness (root-mean-square (rms)) of Pt deposited on substrates with different adhesion layers (SiO$_2$, Al$_2$O$_3$, TiO$_2$, and Nb$_2$O$_5$) through PEALD for Pt up through a cycle number of 20. Here, a lower surface roughness of Pt indicates improved wettability of Pt layer on an oxide surface.

Simulation on the Effect of Nb-Doping in TiO$_2$ Using Density Functional Theory (DFT)

Figure 11:
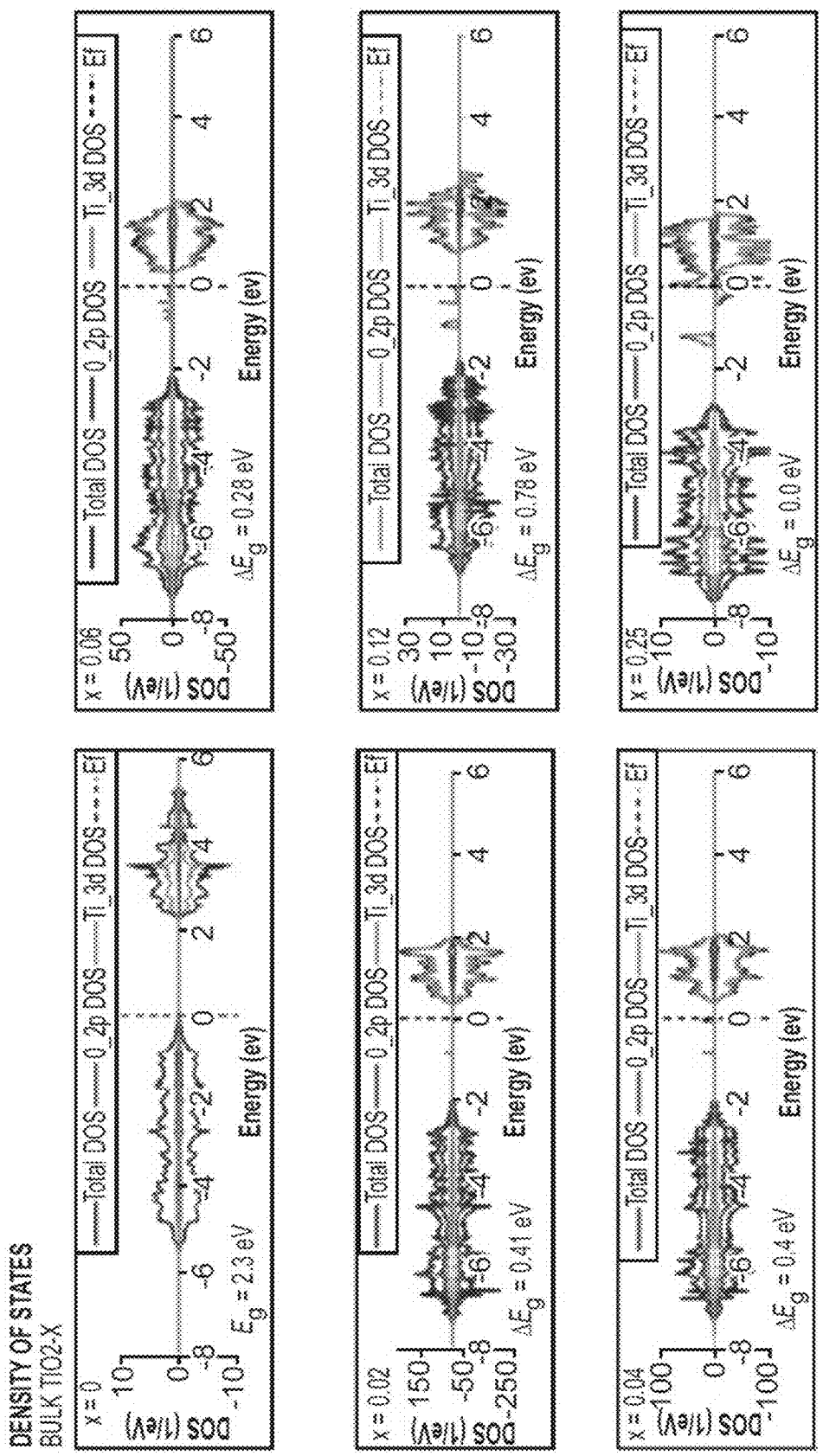
FIG. 11. Simulation results of Nb-doping in $TiO_2$ using density functional theory, at varying doping levels x=0, 0.02, 0.04, 0.06, 0.12, and 0.25.

FIG. 11 shows simulation results of Nb-doping in TiO$_2$ using DFT, at varying doping levels x=0, 0.02, 0.04, 0.06, 0.12, and 0.25. As can be observed, Nb-doping varies a band gap, $\Delta E_g$, which is indicative of an electrical conductivity of the material: a lower $\Delta E_g$ translates into a higher electrical conductivity.

Example 2

Overview

Polymer electrolyte membrane fuel cells (PEMFCs), regarded as the most promising for implementation in the automotive sector, specify the development of efficient electrochemical catalysts. A successful strategy for increasing the techno-economic outlook of PEMFCs is through increasing an intrisic per-atom activity of a catalyst, and thus reducing a specified loading of costly platinum group metals (PGMs). By combined efforts, including electrochemical activity evaluation, transmission electron microscopy (TEM), and X-ray photoelectron spectroscopy (XPS), this example demonstrates that insertion of reducible oxide layers, such as TiO$_2$ and Nb$_2$O$_5$, to form an interface between platinum nanoparticles and carbon substrates (Pt/oxide/C) followed by thermal annealing in a H$_2$ environment can largely enhance a mass activity (electrochemical activity normalized by platinum loading) towards cathodic oxygen reduction reaction (ORR). It is additionally found that this enhancement is attributed to strong metal support interaction (SMSI) between platinum and underlying oxide layers, confirmed by extended X-ray absorption fine structure (EX-AFS) showing changes in i) Pt—Pt bond distances, and ii) Pt coordination numbers (CN).

Introduction

PEMFCs are highly touted as a transformative technology for electrification of the transport sector, particularly for applications where long driving ranges and fast refueling times are of importance. However, the use of significant PGM loadings as electrochemical catalysts for both electrodes creates a cost bottleneck towards the widespread implementation of this technology. A significant emphasis is placed on developing cathode catalysts for ORR, which can be intrinsically sluggish and can be a performance limiting process during PEMFC operation. An attractive approach for ORR catalyst development is using metal oxides (e.g., $TiO_2$, $Nb_2O_5$, $Ta_2O_5$, $SnO_2$, or a combination thereof) as supports for Pt. Benefits of using these oxides include higher reactivity and superior durability, which can arise from SMSI between a catalytically active metal and reducible oxides, especially for $Pt/TiO_2$ and $Pt/Nb_2O_5$. To be specific, the facile formation of sub-stoichiometric oxygen concentration in these reducible oxides can induce a strong interaction with Pt deposits during thermal post-treatment under a reducing atmosphere.

Results

Figure 12:
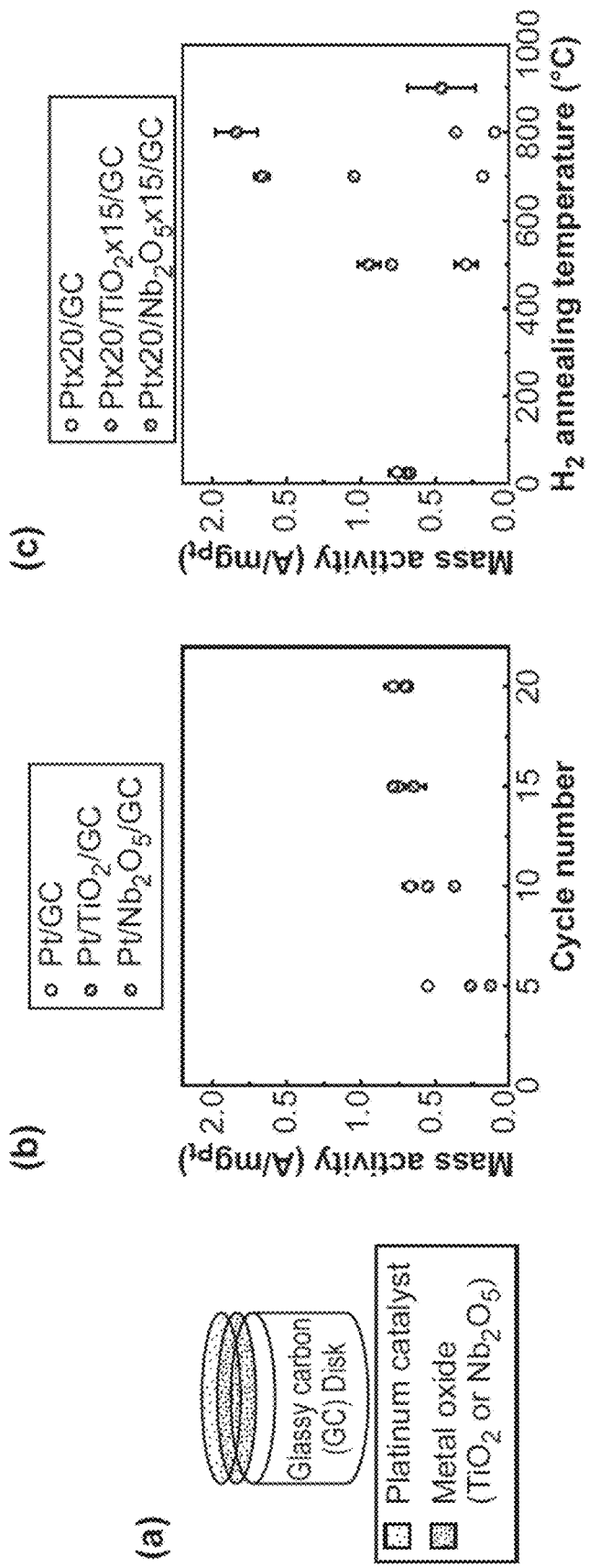
FIG. 12. (a) Schematic of platinum (Pt)/oxide ($TiO_2$ or $Nb_2O_5$)/glassy carbon (GC) catalysts. Both platinum and oxide layers are deposited on GC disk through atomic layer deposition (ALD). Electrochemical properties of GC-supported catalysts (Pt/GC, Pt/$TiO_2$/GC, and Pt/$Nb_2O_5$/GC), recorded at room temperature in about 0.1 M $HClO_4$ aqueous solution. (b) Pt ALD cycle number vs. mass activity (MA, kinetic current densities measured at about 0.9 V vs. reversible hydrogen electrode (RHE), normalized by Pt mass loading) for different catalyst formulations (Pt/GC, Pt/$TiO_2$/GC, and Pt/$Nb_2O_5$/GC) before $H_2$ annealing. (c) Hydrogen thermal post-annealing temperature vs. MA for ALD Pt 20 cycles (Pt×20) on GC, $TiO_2$/GC, and $Nb_2O_5$/GC.

Through atomic layer deposition (ALD), highly active electrochemical catalysts are developed with catalytic formulations of $Pt/TiO_2$ and $Pt/Nb_2O_5$, both supported on carbon, and a schematic of theses catalysts is presented in FIG. 12a. FIG. 12b shows mass activities (MAs) of different catalyst formulations (Pt/GC, $Pt/TiO_2$/GC, and $Pt/Nb_2O_5$/GC with different platinum ALD cycle numbers, and where GC stands for glassy carbon) without $H_2$ thermal post-treatment. For Pt/GC catalysts, the MAs reach a maximum value of about 0.8 $A/mg_{Pt}$ at a Pt ALD cycle number of 20 (unless otherwise noted, Pt ALD cycle number of N is abbreviated to PtxN). Insertion of ultra-thin $TiO_2$ and $Nb_2O_5$ layers with ALD cycle number of 15 ($TiO_2$×15 and $Nb_2O_5$×15, respectively) between Pt and GC exhibits similar saturation behaviors of cycle number vs. MA, and any MA enhancement could not be observed in Pt/oxide/GC without $H_2$ post-annealing. The effects of $H_2$ post-annealing temperature on the MAs of Ptx20 on different substrates are further evaluated (FIG. 12c). Of note, $H_2$ post-annealing significantly improves MAs of both Ptx20/$TiO_2$/GC and Ptx20/$Nb_2O_5$/GC, with maximum values of about 1.84 $A/mg_{Pt}$ (after $H_2$ post-annealing at about 800° C.) and about 1.04 $A/mg_{Pt}$ (after $H_2$ post-annealing at about 700° C.), respectively. The performance improvement is significant by factors of about 2.7 for Pt/$TiO_2$/GC and about 1.5 for Pt/$Nb_2O_5$/GC (comparing the maximum MAs achieved after $H_2$ thermal treatment with those without thermal treatment). $H_2$ annealing at temperatures above about 800° C. (Pt/$TiO_2$/GC) and above about 700° C. (Ptx20/$Nb_2O_5$/GC), where the maximum MAs are achieved, can deteriorate catalytic activities.

Figure 13:
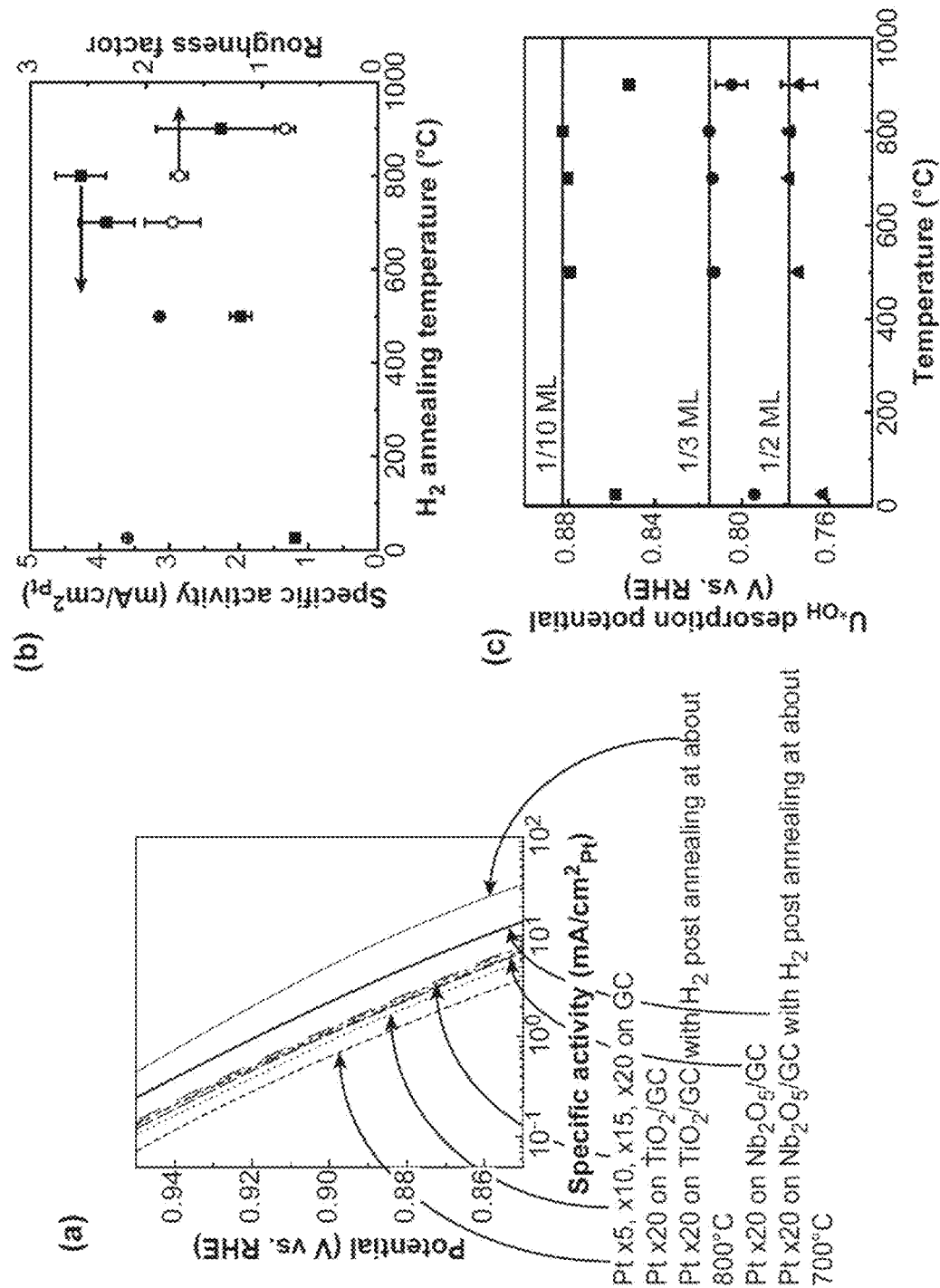
FIG. 13. (a) Tafel plot of specific activity (mA/$cm^2 p_t$) vs. potential for Pt/GC with different ALD cycles (×5, ×10, ×15, and ×20) and Pt×20/$TiO_2$/GC and Pt×20/$Nb_2O_5$/GC with or without hydrogen post-annealing. $H_2$ post-annealing temperature vs. specific activity ($i_s$, kinetic current densities measured at about 0.9 V vs. RHE normalized by roughness factor, RF) and RF for Pt×20/$TiO_2$/GC (b) and OH desorption potential ($U_{*OH}$) liberating about 1/10, about 1/3, and about 1/2 monolayer (ML) of OH groups (c).

Unlike Ptx20/$TiO_2$/GC and Ptx20/$Nb_2O_5$/GC representing an evident "peak-shape" tendency of a relation between temperature and MAs, the MAs of Ptx20/GC continue decreasing with increase of $H_2$ annealing temperature. FIG. 13b shows the evolution of specific activities ($i_s$) and roughness factors (RFs, specified by electrochemically active area (ECSA) divided by a geometric area) with $H_2$ post-annealing temperature for Ptx20/$TiO_2$/GC with the superior MA values: RFs decline gradually with increase of $H_2$ annealing temperatures up to about 800° C., but declines above about 800° C. Due to the decrease in RF, the "peak-shape" relation of temperatures vs. $i_s$ becomes more evident: the highest specific activity of about 4.28 $mA/cm^2_{Pt}$ is achieved from Ptx20/$TiO_2$/C after $H_2$ post-annealing at about 800° C. This specific activity exhibits a significant enhancement by a factor of about 3.6 relative to Ptx20/C (about 1.18 $mA/cm^2_{Pt}$) and Ptx20/$TiO_2$/C $H_2$ without annealing (about 1.19 $mA/cm^2_{Pt}$). These electrochemical observations indicate a more complex chemical transformation of catalysts leading to the changed ORR activity. OH desorption potentials ($U_{*OH}$) exhibit a clear relevancy to the specific current densities (FIG. 13c): hydrogen annealing at about 800° C., where the specific activity was maximized, showed the highest $U_{*OH}$ values of about 0.88, about 0.82, and about 0.78 V to liberate about ⅒, about ⅓, and about ½ monolayers (MLs) of OH groups. The meaning of higher $U_{*OH}$ is that OH species are bound weakly to active sites (here Pt) and the liberation of these species involves less overpotentials (specified by a difference between open circuit voltage and $U_{*OH}$).

Example 3

Process Flow

A fabrication process flow is as follows:

A conductive substrate is provided (such as formed of a carbon-based material or a conductive oxide), which can bond to a catalyst with adequate affinity.

Plasma treatment can be included to form functional groups on the conductive substrate (e.g., air plasma)

A template layer is first deposited on the substrate ($CoO_x$ layer with a thickness of 0 to about 1.5 nm through thermal atomic layer deposition (ALD) at about 160° C., and with 0 to 30 cycles to achieve the aforementioned thickness range). The template layer does not fully cover the substrate, but is in the form of discrete deposits with sizes ranging from about 0.3 nm to about 10 nm.

A catalyst layer is then deposited on the substrate (Pt layer with a thickness of 0 to about 2 nm through thermal ALD at about 120-160° C., and with 0 to 40 cycles to achieve the aforementioned thickness range). For each deposit of the catalyst layer, some portion is bonded to the substrate, and another portion is bonded to a deposit of the template layer.

The template layer is then removed by immersing the entire structure in a solution where a solubility of a material of the template layer and a solubility of a material of the catalyst layer are different (the template material is more soluble than the catalyst material, and a difference of at least one order of magnitude can be desirable). Removal of the template layer leaves at least part of the deposits of the catalyst layer on the substrate, which are strained due to structural constraints imposed by initial bonding with the substrate.

Figure 14:
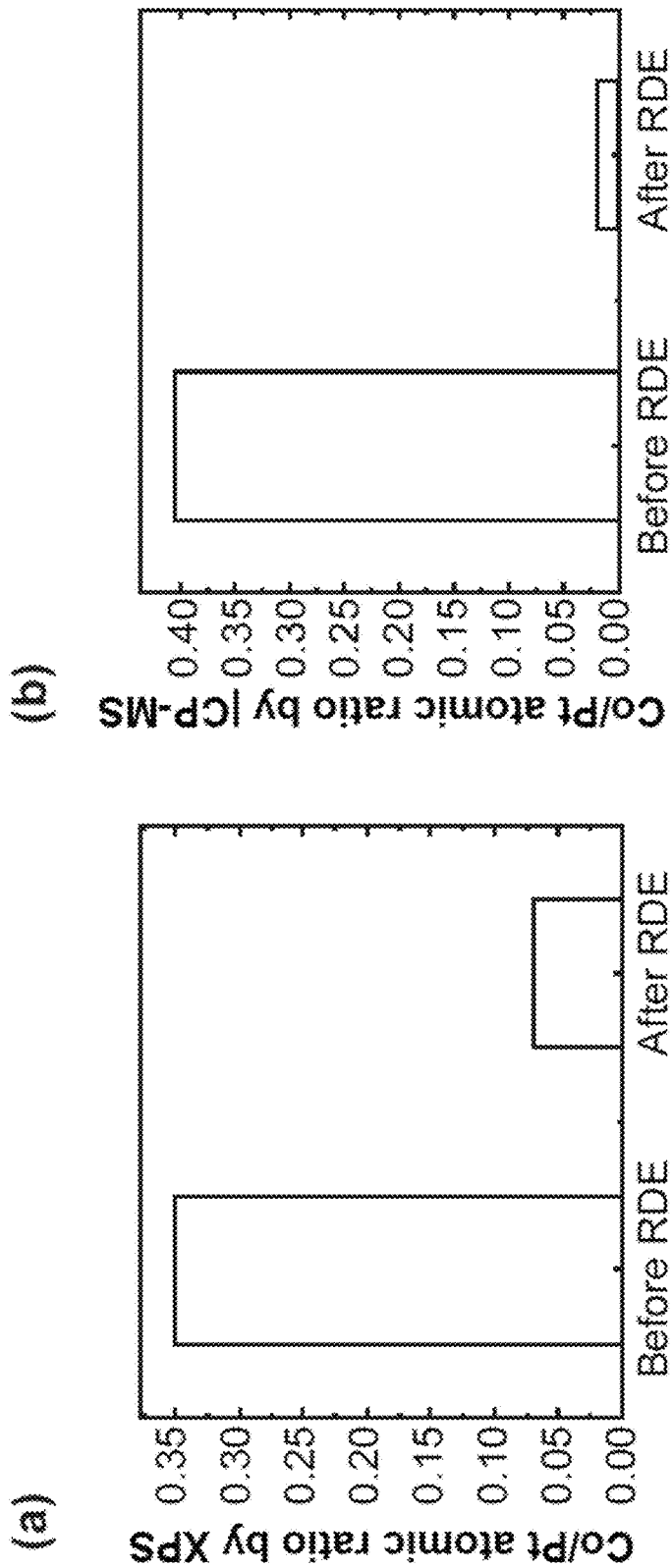
FIG. 14. (a) X-ray photoelectron spectroscopy (XPS) results and (b) inductively coupled plasma mass spectrometry (ICP-MS) results showing that at least a majority of a template layer is removed upon immersion into an acidic solution.

As confirmed by both X-ray photoelectron spectroscopy (XPS) and inductively coupled plasma mass spectrometry (ICP-MS), at least a majority of the template layer (Co) is removed during a rotating disk electrode (RDE) process, where a sample is immersed into an acidic solution in which $CoO_x$ is dissolved (FIG. 14).

Rotating Disk Electrode (RDE) Electrochemical Results

Figure 15:
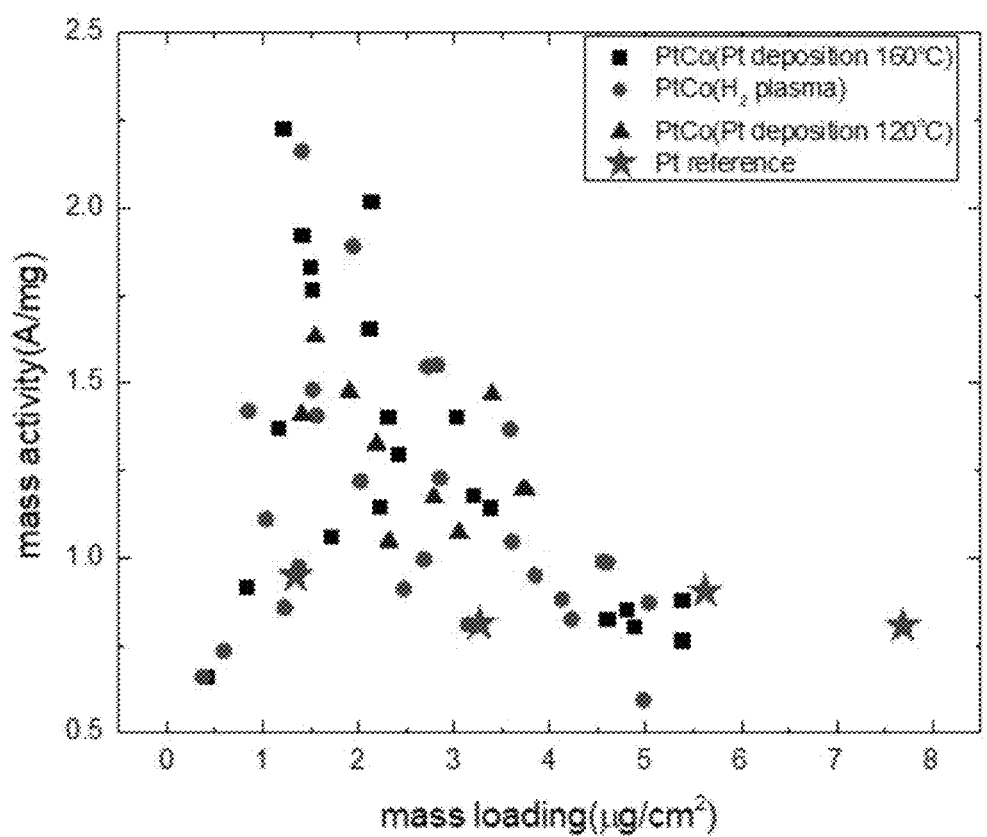
FIG. 15. Mass activity vs. Pt mass loading of PtCo and Pt samples.

According to electrochemical measurements, the incorporation of the cobalt-containing template layer increased the Pt mass activity by a factor of over about 2 (as shown in FIG. 15). The best performing PtCo samples demonstrated a mass activity of 1.89±0.77 A/mgPt, while reference samples with Pt only demonstrated a mass activity below about 0.85 A/mgPt.

Figure 16:
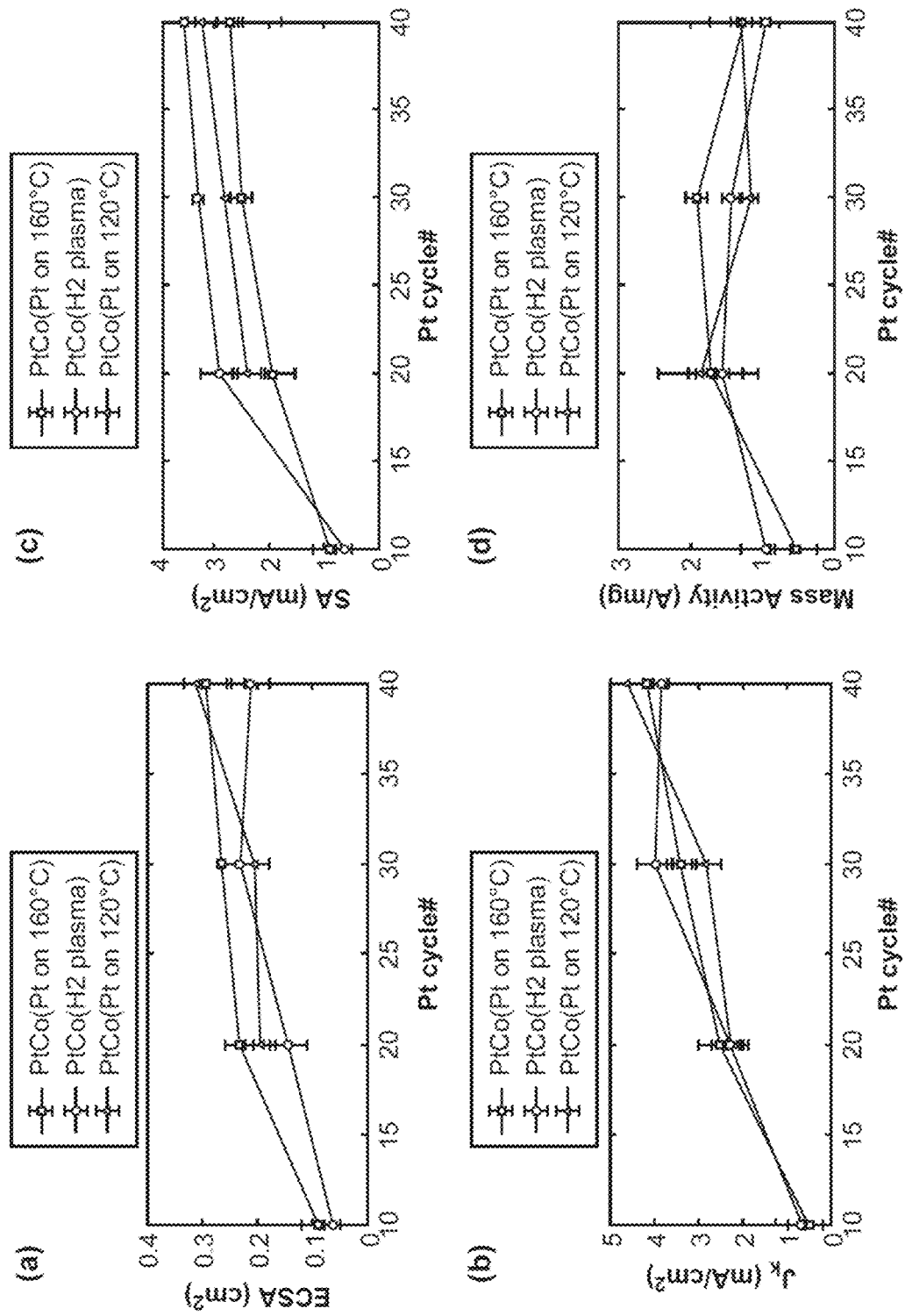
FIG. 16. Electrochemical performance ((a) electrochemical surface area (ECSA), (b) kinetic current density ($J_k$), (c) specific activity (SA), and (d) mass activity (MA)) of Pt/$CoO_x$ with Pt deposited at about 120° C. and about 160° C., and the Pt/$CoO_x$ with Pt deposited at about 120° C. followed by $H_2$ plasma annealing.

Evaluation is also made of the effects of Pt ALD cycle number, deposition temperature, and hydrogen plasma post-treatment on the electrochemical activity. FIG. 16(a), (b) shows that the electrochemical surface area (ECSA) and the kinetic current density ($J_k$) increase with increased Pt cycle numbers. The specific activity (SA) has a tendency for saturation behavior with an increase of Pt cycle number (FIG. 16(c)). Hydrogen plasma-treated samples show an enhancement of specific activity over ones without such treatment. Nevertheless, the mass activity of these samples peaked at about 20-30 Pt ALD cycles (FIG. 16(d)). For the hydrogen plasma-treated samples and samples with Pt deposited at about 120° C., 20 cycles of Pt yielded the highest mass activity. For the samples with Pt deposited at about 160° C., 30 cycles of Pt yielded the highest mass activity.

Example 4

Improving Intrinsic Oxygen Reduction Activity and Stability: Atomic Layer Deposition Preparation of Platinum-Titanium Alloy Catalysts Overview The development of improved activity and stability Pt-based catalysts for the oxygen reduction reaction (ORR) is desired to perpetuate the deployment of polymer electrolyte fuel cell (PEFC) in the transportation sector. In this example, use is made of atomic layer deposition (ALD) of $TiO_2$ and Pt coupled with thermal annealing in a reducing atmosphere to prepare $Pt_3Ti$ alloy ORR electrocatalysts. The optimized $Pt_3Ti$ nanoparticle catalyst provides Pt mass-based ORR activity that is more than about 2-fold higher than either commercial Vulcan carbon black supported Pt (about 46 wt. % Pt/Vulcan) or substantially pure Pt nanoparticles prepared by ALD. This improvement is largely due to enhanced activity of $Pt_3Ti$ alloy catalyst, as measured by specific activity that is about 5.3-fold higher than commercial Pt/Vulcan and about 3-fold higher than polycrystalline Pt. Furthermore, remarkable stability is demonstrated by applying 10,000 electrochemical potential cycles (about 0.6 to about 1.0 V vs. reversible hydrogen electrode (RHE)) in $O_2$ saturated about 0.1 M $HClO_4$ electrolyte, whereby nearly identical ORR activity is observed before and after this accelerated durability protocol. The process of $Pt_3Ti$ preparation and resulting catalyst structure is investigated using transmission electron microscopy (TEM) and X-ray absorption spectroscopy (XAS) that indicate a $H_2$ treatment temperature of about 700-800° C. is optimal for forming an alloy structure without inducing significant nanoparticle agglomeration. To gain fundamental insight into this Pt—Ti alloy catalyst system, use is made of density functional theory (DFT) to understand the nature of the observed ORR activity enhancements. By combining computational investigations with results of experimental approach, it is postulated that the ORR activity improvements result from a combination of strain and ligand effects. Both the facile fabrication of alloys by ALD and the fundamental insight gathered from combined experimental and simulation efforts can be leveraged for the design of catalysts with further improved activity and stability for PEFC applications.

Introduction

PEFC technologies are complementary to battery technologies as they are capable of providing sustainable electrification of the transport sector, while allowing for extended driving range and fast refueling times. However, the use of expensive Pt group metals as electrocatalysts in PEFCs creates a cost barrier towards the widespread commercialization of this technology, and electrocatalyst stability is still insufficient for desired long-term operation. Therefore, considerable efforts in electrocatalyst and electrode development has focused on reducing Pt contents and improving catalyst stability, bolstered by supports from the Fuel Cell Technologies Office within the U.S. Department of Energy (DOE), among other government agencies. Specifically, significant emphases have been placed on developing cathode catalysts for the oxygen reduction reaction (ORR), which is intrinsically kinetically sluggish and accounts for the greatest losses in voltage during PEFC operation. A significant portion of Pt-based ORR catalyst development efforts involve either the development of Pt-alloy catalysts to improve the ORR activity through electronic perturbations, or the development of corrosion-resistant (e.g., $TiO_2$, $Nb_2O_5$, and $SnO_2$) Pt nanoparticle supports to improve both activity and stability. A key challenge facing the development of Pt-alloy catalysts is the intrinsic instability of various base metals (e.g., Co, Ni, and Fe) that can undergo dissolution under PEFC operating conditions, resulting in a loss of the activity enhancements gained through alloying and reducing the proton conductivity of the ionomer and electrolyte.

In an attempt to identify improved activity of ORR electrocatalysts without compromised stability, studies involving computational screening of various Pt- and Pd-alloys take into account alloy formation energies as a descriptor for stability and oxygen adsorption energies as a descriptor for activity. Supplemented by experimental investigations, identification is made of $Pt_3Y$ and $Pt_3Sc$ as highly active and stable catalysts for the ORR. Subsequent efforts are extended to include other Pt-lanthanide alloys; however, translating these concepts towards the development of practical nanoparticle catalysts has been challenging owing to the high oxo-philicity of the lanthanide series metals. $Pt_3Ti$ is also identified computationally as a potentially active and intrinsically stable alloy composition, with an alloy formation energy of about −0.80 eV—significantly more negative than other Pt—Co alloys (about −0.02 eV). Furthermore, Ti is generally less oxo-philic than lanthanide metals and therefore more amenable to straightforward synthetic approaches (bond dissociation energies of Ti—O, Gd—O, and Y—O are about 662, about 716, and about 715.1 kJ/mol, respectively). Experimentally evaluation is made of the ORR activity of a series of polycrystalline $Pt_3M$ electrodes (M=Ti, V, Fe, Co, and Ni), whereby a modest improvement is demonstrated for $Pt_3Ti$ in comparison to polycrystalline Pt. This was explained by the $Pt_3Ti$ surface having binding energies with adsorbed reaction intermediates (e.g., OOH*, O*, OH*) that were weaker than optimal for ORR. However, this constraint can be addressed by tuning the alloy configuration in the near-surface region or through nanostructuring effects which can induce stronger oxygen adsorption energies by under-coordinated surface sites in nanoparticulate catalysts. However, the preparation of structurally-ordered $Pt_3Ti$ nanoparticles has still been challenging using other synthetic approaches, largely due to the significantly different reversible potentials for the reduction of Pt vs. Ti ions ($Pt^{2+}\pm 2e^- \rightarrow Pt(s)$ at +1.18 eV vs. RHE, $Ti^{2+}2e^- \rightarrow Ti(s)$ at −1.6 eV vs. RUE) that lead to difficulties achieving alloying between these two metals.

To address this challenge, this example reports the use of atomic layer deposition (ALD) of Pt and $TiO_2$ in combination with a subsequent reduction stage to prepare Pt—Ti alloys. Particularly, ALD is a process that can be used for deposition of Pt and $TiO_2$, and is an attractive approach as it provides atomic level control over the deposition of each individual component. Furthermore, ALD has capability for preparing Pt nanoparticles on high surface area support materials, a criterion for the preparation of practical PEFC catalysts. In this example, use is made of ALD to deposit $TiO_2$ onto carbon-based substrates followed by ALD of Pt to exploit the affinity of Pt ALD precursors towards $TiO_2$ surfaces. This affinity ensures that Pt and $TiO_2$ are in close contact, and, due to the strong metal support interactions between Pt and $TiO_2$, allows facile Pt—Ti alloy formation through a subsequent thermal treatment in $H_2$. Through this approach, successfully synthesis is made of highly active $Pt_3Ti$ nanoparticle catalysts with a specific activity of about 3× higher than that of polycrystalline Pt, and a mass activity more than about two-fold higher that pure Pt nanoparticles prepared by ALD or commercial Pt nanoparticle catalysts supported on Vulcan carbon black (Pt/Vulcan). The process of Pt—Ti alloy formation and resulting catalyst properties were characterized using high resolution transmission electron microscopy (HRTEM) and spectroscopic techniques including X-ray absorption spectroscopy (XAS) to probe the electronic structure and atomic configuration of Pt atoms within the catalyst. Furthermore, use is made of density functional theory (DFT) to investigate the mechanisms underlying the ORR activity enhancement observed, thereby advancing the understanding of Pt—Ti catalysts that can guide the further development of bimetallic electrocatalysts for ORR with improved activity and stability.

Results and Discussion

Figure 17:
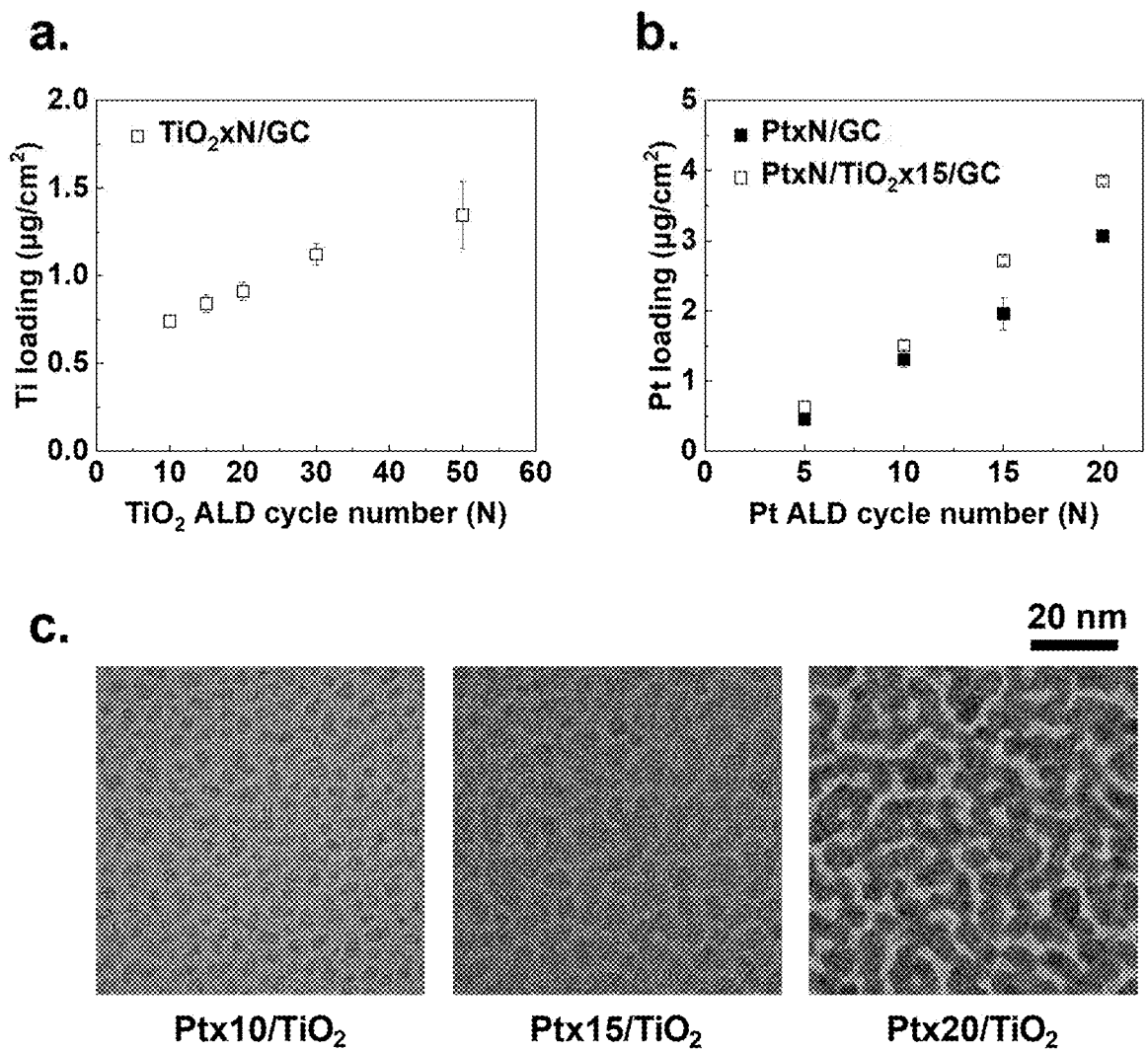
FIG. 17. (a) Ti loading as a function of the number of $TiO_2$ ALD cycles (N=10, 15, 20, 30, and 50). (b) Pt loading as a function of the number of Pt ALD cycles (N=5, 10, 15, and 20) for Pt deposition on GC and $TiO_2$×15/GC. (c) Top-view bright-field high resolution transmission electron microscopy (HRTEM) images of Pt×N (N=10, 15, and 20) deposited on $TiO_2$-coated amorphous carbon TEM grids.

The deposition of $TiO_2$ and Pt by ALD was investigated on glassy carbon (GC) substrates. This substrate was chosen due to its structural similarities with the high surface area carbon supports used for PEFC catalysts, along with that GC is electronically conductive and electrochemically inert in acidic electrolytes, allowing reliable ORR activity evaluation of catalyst materials deposited on the surface. FIG. 17a demonstrates the ability to control the loading of Ti (deposited as $TiO_2$) on glassy carbon through varying the number of ALD cycles. The deposition of Pt by ALD with N (number of) cycles on GC substrates with or without 15 cycles of $TiO_2$ ALD coating (PtxN/GC and PtxN/$TiO_2$×15/GC, respectively) was investigated, demonstrating a linear growth rate as a function of cycle number as shown in FIG. 17b. A benefit of using a thin $TiO_2$ under-layer for Pt ALD is the enhanced growth rate in comparison to bare GC (black squares in FIG. 17b). The morphology of the deposited Pt particles was further investigated by carrying out Pt ALD on the surface of ultrathin (about 3 nm) amorphous carbon-coated transmission electron microscopy (TEM) grids that were first coated with $TiO_2$ by ALD. FIG. 17c displays HRTEM images showing the evolution of the Pt nanoparticle morphology as a function of Pt ALD cycle number. Initially, distinct Pt nanoparticles were observed after 10 cycles (Pt×10, FIG. 17c—left), with subsequent cycles resulting in interconnected particles forming branch-like structures (Pt×15, FIG. 17c—center). Increasing the number of cycles to 20 (Pt×20, FIG. 17c—right) leads to further horizontal nanoparticle expansion along with growth in the vertical direction that is indicated by the significant darkening of the deposited regions.

Figure 18:
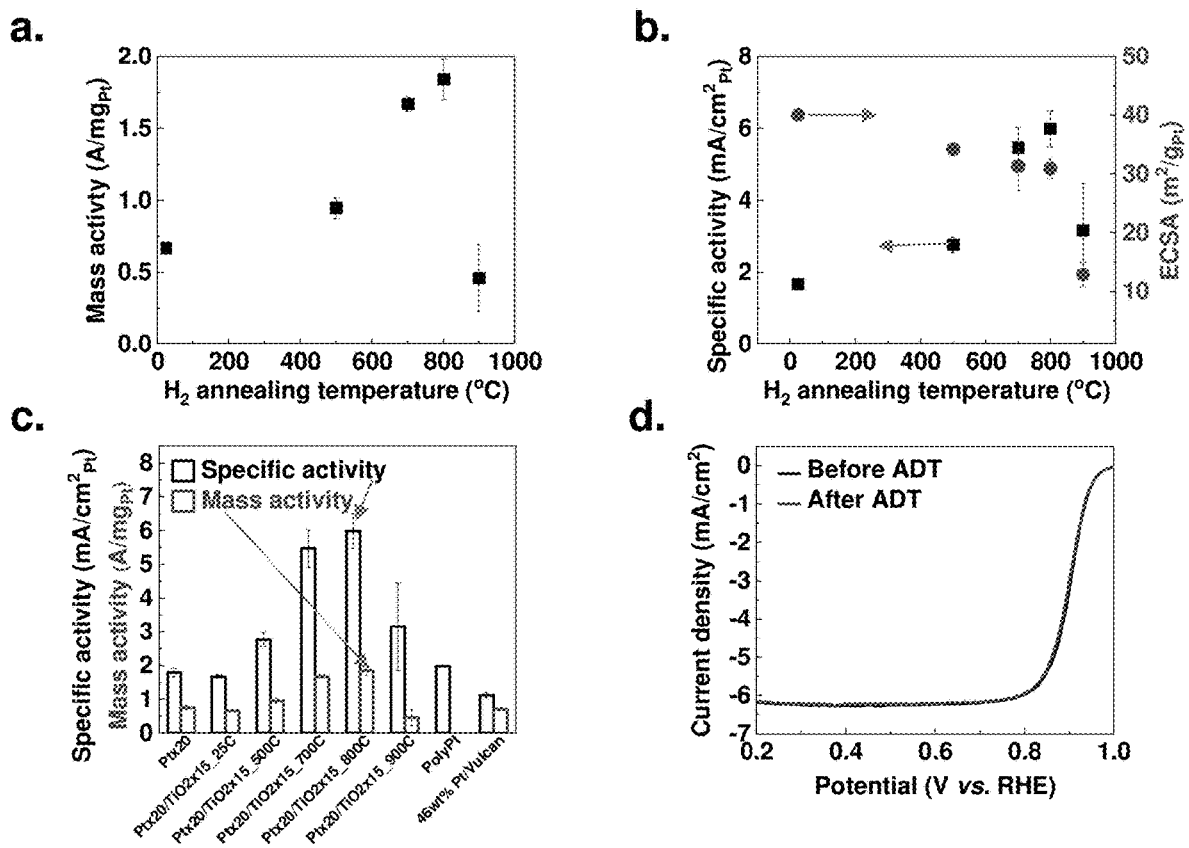
FIG. 18. (a-c) Effects of thermal annealing of Pt×20/$TiO_2$×15/GC in $H_2$ at various temperatures on (a) Pt-based mass activities at about 0.9 V vs. RHE and (b) ECSAs and the specific activities at about 0.9 V vs. RHE. Note that the case of 25° C. is the as-deposited sample. (c) Summary of the specific activities and the Pt-based mass activities of i) Pt×20, ii) Pt×20/$TiO_2$×15 with different $H_2$ annealing temperatures (about 25-900° C.), iii) polycrystalline platinum (just the specific activity is available for this case), and iv) commercial Pt/C (about 46 wt. % Pt/Vulcan (TKK)). (d) ORR polarization curves at about 1600 rpm for Pt×20/$TiO_2$×15/GC annealed under $H_2$ at about 800° C. before and after accelerated-durability-test (ADT) (10,000 cycles between about 0.6 and about 1.0 V vs. RHE in $O_2$ saturated about 0.1 M $HClO_4$).

To induce the formation of Pt—Ti alloy structures from the structure composed of Pt deposited on $TiO_2$ layers, thermal annealing in $H_2$ of the ALD prepared samples was conducted at temperatures between about 500 and about 900° C. The electrochemical activities of the resulting catalysts were evaluated by rotating disk electrode (RDE) testing in about 0.1 M $HClO_4$ electrolyte, with ORR polarization and baseline cyclic voltammetry (CV) characterizations. The effects of $H_2$ annealing temperature on the Pt-based mass activity towards the ORR at an electrode potential of about 0.9 V vs. RHE is shown in FIG. 18a. A $H_2$ treatment temperature of about 800° C. shows a maximum activity of about 1.84 A/$mg_{Pt}$, an about 2.8× enhancement in comparison to Pt×20/$TiO_2$×15/GC without $H_2$ treatment (denoted as the 25° C. sample). FIG. 18b shows the electrochemical surface area (ECSA, $m^2$/$gp_t$) and the related specific activity at about 0.9 V vs. RHE as a function of $H_2$ treatment temperature for the Pt×20/$TiO_2$×15/GC catalysts. The ECSA decreases gradually from about 40.0 to about 30.9 $m^2$/$gp_t$ with an increase in $H_2$ treatment temperature up to about 800° C., with a significant drop to about 12.8 $m^2$/$gp_t$ observed upon further increasing the temperature to about 900° C. The specific activity reaches a maximum of about 5.99 mA/$cm^2_{Pt}$ at about 0.9 vs. RHE for the sample treated at a temperature of about 800° C. (FIG. 18c), representing a more than about 3-fold activity improvement over as-prepared Pt×20/$TiO_2$×15/GC (about 1.66 mA/$cm^2p_t$), along with Ti-free Pt×20/GC (about 1.79 mA/$cm^2p_t$) and a polycrystalline Pt electrode (Poly-Pt, about 1.98 mA/$cm^2p_t$) measured as references. This best performing catalyst (Pt×20/$TiO_2$×15/GC annealed at about 800° C.) also exhibits the best Pt mass-based activity that was more than about 2-fold higher than commercial Vulcan carbon black supported Pt (about 46 wt. % Pt/Vulcan). To probe the electrochemical stability of the Pt×20/$TiO_2$×15/GC catalyst treated at about 800° C. in $H_2$, an accelerated-durability-test (ADT) composed of 10,000 electrode potential cycles between about 0.6 and about 1.0 V vs. RHE in $O_2$ saturated about 0.1 M $HClO_4$ was performed. The catalyst maintained its excellent ORR activity through this process, with almost identical ORR activity (FIG. 18d) and ECSA values determined before and after ADT.

Figure 19:
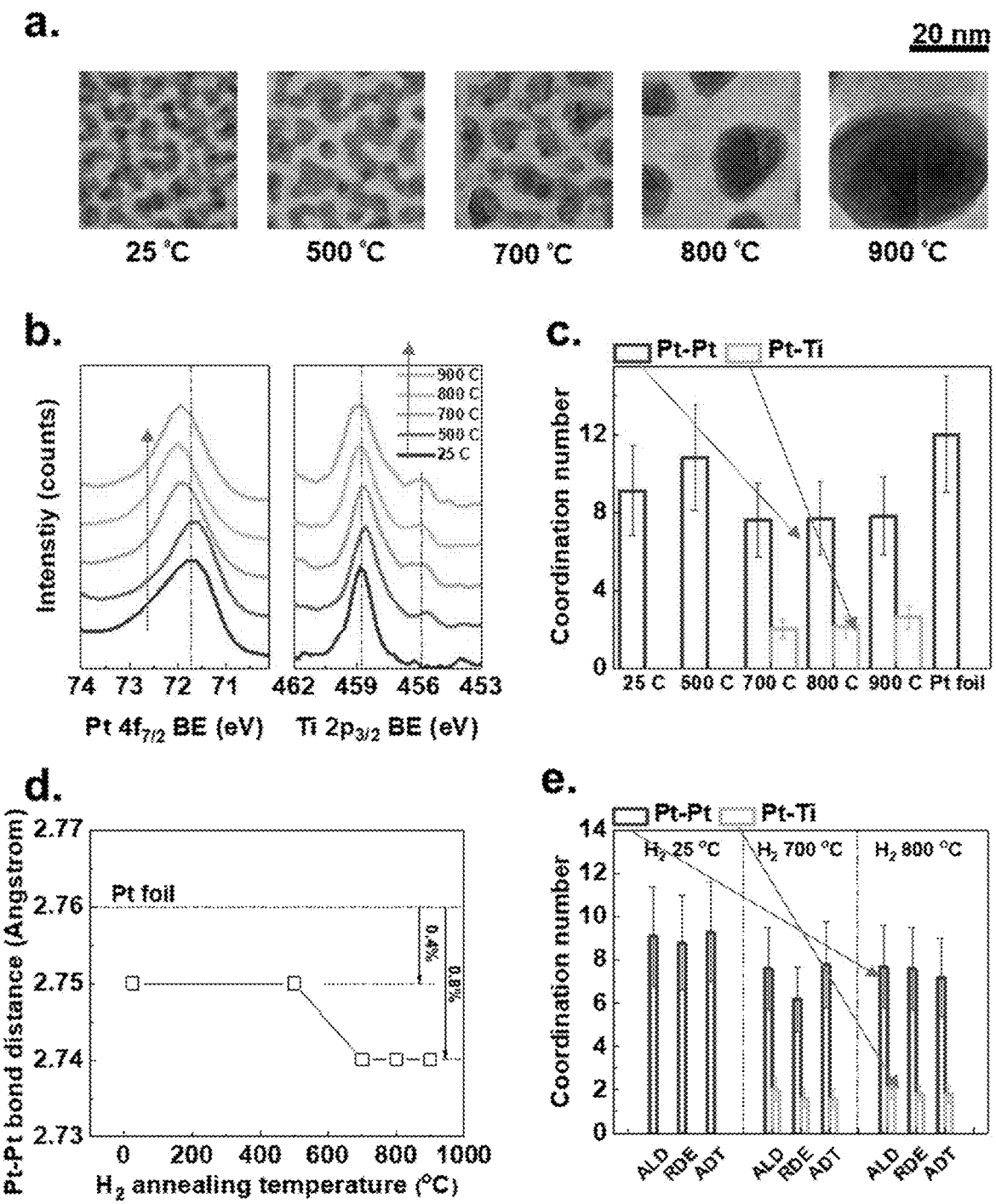
FIG. 19. (a) Top-view bright-field HRTEM images of Pt×20/$TiO_2$×15/GC as a function of $H_2$-annealing temperature (about 25-900° C.). Note that the case of 25° C. is the as-deposited sample. (b) Pt $4f_{7/2}$ and Ti $2p_{3/2}$ XPS results of Pt/$TiO_2$×15/GC with respect to $H_2$ thermal annealing temperatures (about 25-900° C.). (c-e) X-ray absorption (XAS) results showing coordination numbers (CNs) and Pt—Pt bond distances ($R_{Pt-Pt}$), including the evolution of (c) CNs of Pt—Pt and Pt—Ti and (d) Pt—Pt bond distance ($R_{Pt-Pt}$) for Pt×20/$TiO_2$×15/GC with respect to $H_2$ thermal annealing temperature. The evolution of (e) CNs of Pt—Pt and Pt—Ti of Pt×20/$TiO_2$×15/GC with different annealing temperatures (as deposited, about 700, and about 800° C.) after initial activity measurement (denoted by RDE) and ADT. CNs of the as-deposited sample are presented with a notation of ALD.

To gain insight into the physical and chemical properties underlying the significant ORR activity enhancement observed following thermal annealing in $H_2$, the catalysts were characterized by various microscopic and spectroscopic techniques. The effects of $H_2$ annealing temperature on morphology are depicted in FIG. 19a, showing the HRTEM images of Pt×20/$TiO_2$×15 deposited on amorphous carbon coated TEM grids, which have a similar surface chemistry to that of GC substrates, albeit with less surface roughness (root mean squared (RMS) roughness of about 1 Å for the carbon coated TEM grids and about 19 Å for glassy carbon). The thermal annealing in $H_2$ induces morphological changes, whereby the platinum nanoparticles show gradual coalescence up to about 700° C. in the form of a branched morphology. Increasing the heat treatment temperature from about 700 to about 800° C. induces more significant Pt agglomeration into particles with diameters larger than about 10 nm. Interestingly, the trends from electrochemical characterization indicate a very minor decrease in ECSA with this $H_2$ annealing temperature increase (FIG. 18b), not necessarily expected given the significant particle agglomeration observed by HRTEM. It is postulated that this arises due to the aforementioned differences in the surface roughness for GC (RMS roughness about 19 Å) versus the carbon coated TEM grids (about 1 Å). The significantly higher surface roughness of GC increases the average path length for particle migration, thereby likely suppressing significant particle agglomeration until a slightly higher temperature. This hypothesis is consistent with the dramatic reduction in ECSA observed from a H$_2$ thermal annealing temperature of about 800 to about 900° C. (FIG. 18b). X-ray photoelectron spectroscopy (XPS) was further conducted to understand the evolution of chemical states of Pt/TiO$_2$×15/GC after H$_2$ thermal treatment, with clear changes in the electronic structures of Pt and Ti observed in the spectra (FIG. 19b). For metallic Pt, the shift in the Pt 4f$_{7/2}$ peak observed with the increase in H$_2$ annealing temperature above about 500° C. indicates the formation of Pt—Ti bonds within the catalyst. For Ti 2p$_{3/2}$ spectra, although the majority of Ti is present in 4$^+$ state (peak at about 459 eV), a peak around 455.5 eV emerges, consistent with metallic Ti found in a Pt—Ti alloy.

To more rigorously probe the formation of the Pt—Ti alloy resulting from thermal annealing in H$_2$, Pt L3 XAS characterization of the catalyst materials was conducted. Extended X-ray absorptions fine structure (EXAFS) fittings were conducted to determine the average coordination numbers (CNs) of the Pt atoms in Pt×20/TiO$_2$×15/GC samples H$_2$-treated at different temperatures, as shown in FIG. 19c. For Pt×20/TiO$_2$×15/GC, the as-prepared sample and the sample annealed in H$_2$ at about 500° C. shows no noticeable Pt—Ti coordination, indicating these species are mostly still present as two distinct phases (Pt and TiO$_x$) in the catalyst materials. The formation of Pt—Ti coordination is confirmed for samples H$_2$-annealed at or above about 700° C., and the ratios of the Pt—Pt CN (CN$_{Pt-Pt}$) to Pt—Ti CN (CN$_{Pt-Ti}$) of those samples are about 3.8, about 3.7, and about 3.0 at about 700, about 800, and about 900° C., respectively. The decrease in the ratios at higher temperatures could be explained by an increase in the formation of Pt$_3$Ti due to greater intermixing of Pt and TiO$_x$. Fast Fourier transform (FFT) diffraction patterns of the catalysts annealed at different temperatures in H$_2$ also indicates the formation of the structurally-ordered Pt$_3$Ti intermetallic structure at annealing temperatures above about 700° C. Pt—Pt bond distances (R$_{Pt-Pt}$) determined through EXAFS fitting are shown in FIG. 19d. The reference Pt foil showed a (R$_{Pt-Pt}$) of about 2.76 Å. The R$_{Pt-Pt}$ values of all as-deposited ALD-based catalysts were about 2.75 Å, representing an about 0.4% contraction versus the Pt-foil, which is an observation for nanoparticles. H$_2$ annealing up to about 500° C. does not induce any noticeable changes in the R$_{Pt-Pt}$ for Pt×20/TiO$_2$×15/GC; however, thermal annealing in H$_2$ beyond about 500° C. causes further contraction in the Pt—Pt bond distance, namely about 0.8% contraction versus the Pt-foil reference. The electrochemical stability of these Pt—Ti alloys was also probed by EXAFS analysis of the Pt×20/TiO$_2$×15/GC, revealing minimal changes in the CN$_{Pt-Pt}$ and CN$_{Pt-Ti}$ (FIG. 19e) and R$_{Pt-Pt}$ values observed after the initial ORR activity measurement (denoted RDE) and following ADT, indicating that the bulk Pt—Ti alloys are electrochemically stable under the conditions investigated.

Figure 20:
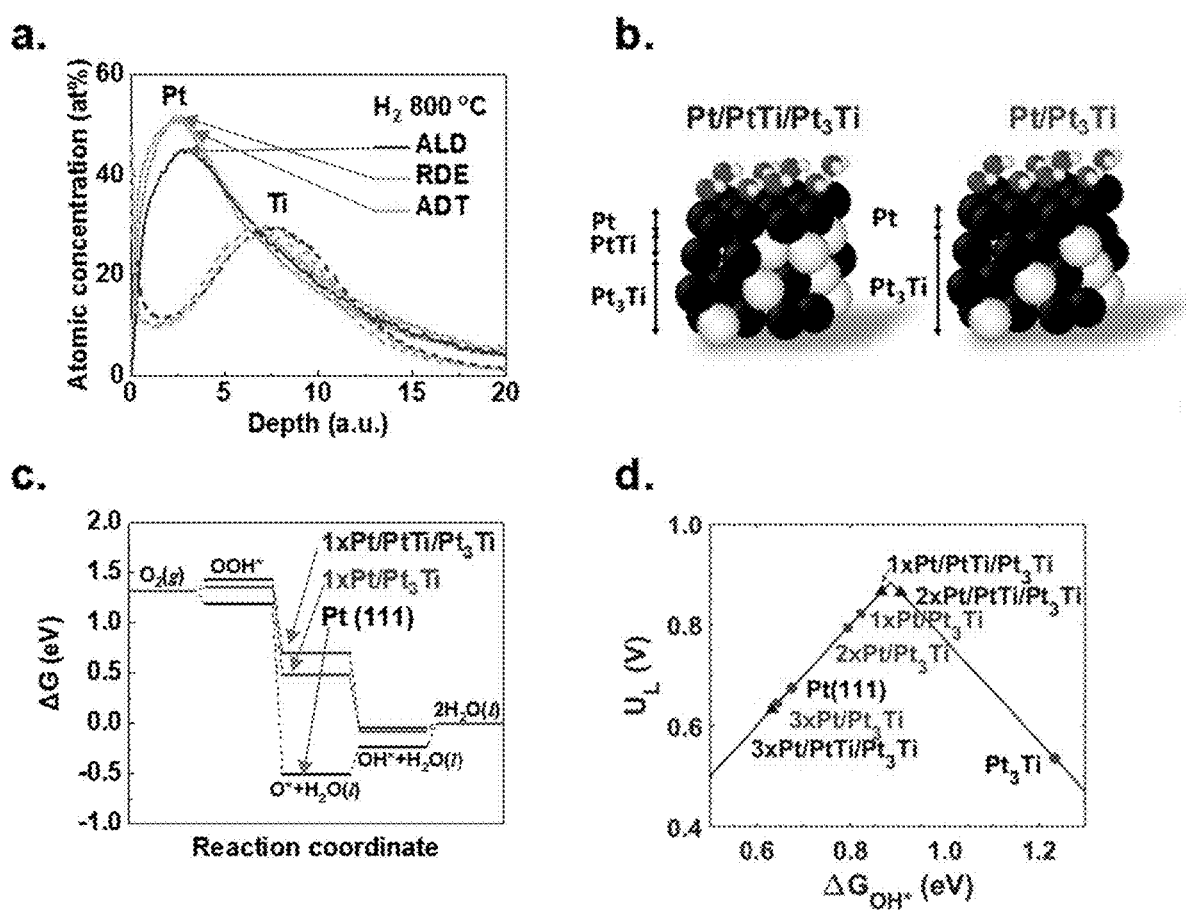
FIG. 20. (a) Secondary ion mass spectroscopy (SIMS)-measured atomic concentration evolution with respect to sputter depth (depth profiles with solid-line represent Pt and depth profiles with dotted-line represent Ti; other elements, carbon and oxygen are not included in this figure. (b) Two possible models, Pt/PtTi/$Pt_3$Ti and Pt/$Pt_3$Ti, examined by density functional theory (DFT) for their oxygen reduction reaction (ORR) activity. (c) Calculated free energy diagram for ORR at a potential of about 0.9 V vs. RHE for Pt(111), 1×Pt/PtTi/$Pt_3$Ti, and 1×Pt/$Pt_3$Ti. (d) Volcano relationship plot of ORR activities represented by limiting potentials ($U_L$) vs. OH binding energies with water stabilization ($\Delta G_{OH}*$) calculated by DFT for different alloy models in (111) crystal lattice (bulk-terminated $Pt_3$Ti, n×Pt/PtTi/$Pt_3$Ti, and n×Pt/$Pt_3$Ti, where n=1, 2, 3). On bulk-terminated $Pt_3$Ti surface, OH* binding energy is calculated on the Pt site without explicit water molecules.

The ORR enhancement of Pt-based bimetallic electrocatalysts can arise from the formation of a Pt over-layer structure with modulated electronic and geometric structure induced from an underlying alloy. The composition of the near-surface layer plays a significant role on oxygen adsorption energies and, by extension, the catalytic activity. As such, it is postulated that surface reconstruction of the Pt$_3$Ti alloy catalysts occurred during electrochemical testing, based on the observation of a steady increase in ORR activity as a function of the number of cycles of electrochemical activation in O$_2$-saturated about 0.1 M HClO$_4$ electrolyte by linear sweeping voltammetry (LSV). For the Pt×20/TiO$_2$×15/GC catalyst annealed in H$_2$ at about 800° C., activation is made of the catalyst by cycling the electrode potential between about −0.01-1 V vs. RHE at a scan rate of about 20 mV/s and with about 1600 rpm electrode rotation. Continuous increases in activity were observed up to about 30 activation cycles, after which stable ORR polarization curves were obtained. Conversely, the pure Pt catalyst (Pt×20) showed relatively minimal activity improvements as a function of cycle number and stable polarization curves observed after approximately just ten activation cycles. To probe the near surface compositions, dynamic secondary ion mass spectroscopy (SIMS) analyses are performed to investigate the compositional gradients of Pt and Ti in these samples before and after electrochemical testing (FIG. 20a). For the surface regions, platinum enrichment was clearly observed after electrochemical testing (both RDE and ADT) compared to the as-prepared sample (labelled ALD). Throughout the bulk compositional depth profiles were similar for the three samples indicating that changes due to electrochemical processes predominantly occurred at or near the surface.

With this structural insight, DFT calculations are performed to explore possible mechanisms underlying the enhanced ORR activity observed. Two Pt—Ti alloy catalysts were modeled through different Pt over-layer formation mechanisms (leaching vs. exchanging), where the topmost Ti-containing layer is either 50% Ti (Pt/PtTi/Pt$_3$Ti) or 25% Ti (Pt/Pt$_3$Ti) (FIG. 20b), respectively. Both models were considered with n number of Pt over-layers, where n is 1, 2, or 3. Relative to the pure Pt(111) slab, prediction is made of 0.85% compressive strain induced on over-laying Pt slabs for both models. This value is very close to the experimentally observed strain of about 0.8% determined by EXAFS fitting on Pt×20/TiO$_2$×15/GC H$_2$-annealed above about 700° C. (FIG. 19d). Such strain is predicted to weaken the OH* binding energy by about 0.04 eV, indicating that further increases in the limiting potential are due to ligand effects of the under-lying alloy.

Figure 21:
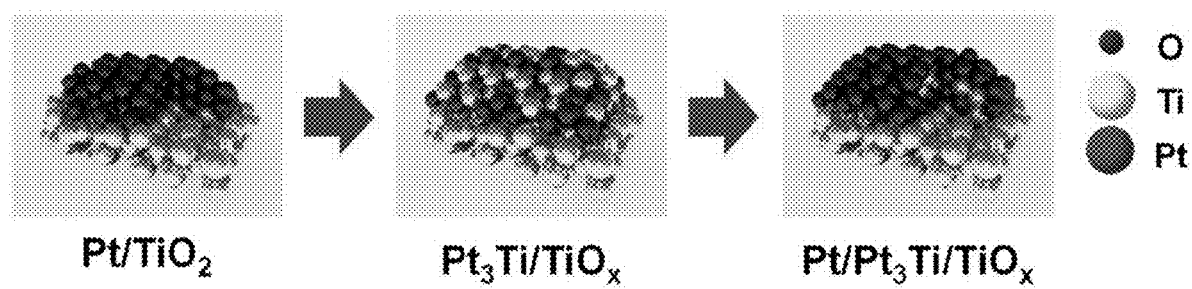
FIG. 21. Proposed formation of a catalyst, first in the form of as-deposited Pt/$TiO_2$, followed by $H_2$ thermal annealing to result in $Pt_3$Ti/$TiO_x$, and followed by electrochemical activation to result in Pt/$Pt_3$Ti/$TiO_x$.

Computation is made of adsorption energies of three ORR intermediates, O*, OH*, and OOH*, on Pt$_3$Ti(111) alloy based structures and comparison is made of the findings to unstrained Pt(111). The free energy diagram at a potential of about 0.9 V vs. RHE (FIG. 20c) compares the thermodynamic free energy landscape of both Pt—Ti model surfaces with Pt(111). The surfaces with the thinnest Pt over-layer (n=1) provide the largest modulation in adsorption strengths of oxygen intermediates. The limiting step on 1×Pt/PtTi/Pt$_3$Ti is calculated to be the activation of O$_2$ into OOH* (first ORR elementary step, O$_2$+4H$^+$+4e$^−$→OOH*+3H$^+$+3e$^−$, and on 1×Pt/Pt$_3$Ti is calculated to be the desorption of OH* (last ORR elementary step, OH*+H$^+$+e$^−$ +H$_2$O (l)→2H$_2$O (l)). It is found that the limiting potential and step could be modulated through the proximity of Ti atoms in the subsurface layer that can weaken the adsorption energetics of oxygen intermediates with the surface Pt layer. ORR performance was evaluated by the calculated limiting potential (U$_L$), or the highest potential where all reaction steps become exergonic, as a function of the change in free energy of OH*, ΔG$_{OH}$*. The free energy of the OH* intermediate is used as the descriptor since it leads to the highest prediction robustness for the ORR. Theoretical U$_L$ values for Pt(111) and Pt—Ti alloys are shown on an activity volcano following the Sabatier principle in FIG. 20d. It is calculated that Pt(111) overbinds oxygen, leading to less optimal ORR energetics by a difference of about 0.2 eV from the scaling-limited maximum limiting potential U$_L$. Relative to a pure Pt(111) slab, both n=1 and 2 over-layers of Pt on models n×Pt/PtTi/Pt$_3$Ti and n×Pt/Pt$_3$Ti are calculated to have a weaker OH* binding energy by about 0.11-0.23 eV and therefore a higher theoretical $U_L$. This reflects a weakening of oxygen binding energies on Pt metal with a Pt—Ti alloy subsurface composition. However, near the top of the volcano distinguishability of $U_L$ between surfaces is the lowest due to propagation of uncertainty throughout the thermodynamic model. This makes it difficult to predict whether a surface is energetically better than Pt(111) with a high degree of certainty in DFT. The exchange-correlation Bayesian Error Estimation Functional with Van der Waal corrections (BEEF-vdW) is used for the built-in uncertainty quantification capability within DFT. The level of agreement between energies generated by BEEF-vdW is specified as an interval confidence value ($c_i$) for calculating whether the adsorption energy on a surface lies in the interval between strongly and weakly binding reference surfaces. Based on this analysis, it is found that there is 99% confidence that OH* adsorption on 1×Pt/PtTi/Pt$_3$Ti and 1×Pt/Pt$_3$Ti is between the adsorption energies that correspond to relatively strong binding Pt(111) and relatively weak binding Au(100) surfaces. Au(100) was chosen as the weak-binding reference because it is predicted to have a similar $U_L$ as Pt(111). This gives high degree of confidence that $U_L$ of such Pt—Ti alloy surfaces would surpass both reference metals. Since the observed strain is predicted to weaken OH* by <about 0.1 eV, improvement in the ORR performance observed both experimentally and computationally indicates that strain effects are not purely responsible. Generally, the OH* binding energy of both models approaches that of pure Pt(111) as ligand effects of the underlying alloy weaken through a thicker Pt layer. Computational analyses indicate a promising approach to prepare highly active catalysts is to prepare over-layer structures with a low number of Pt layers. Increases in activity observed experimentally, therefore, may be rationalized by both ligand effect of underlying titanium lattice at thinner Pt over-layers and strain effects dominating at thicker Pt over-layers. FIG. 21 shows a proposed formation of a catalyst, first in the form of as-deposited Pt/TiO$_2$, followed by H$_2$ thermal annealing to result in Pt$_3$Ti/TiO$_x$, and followed by electrochemical activation to result in Pt/Pt$_3$Ti/TiO$_x$.

CONCLUSION

ALD of TiO$_2$ and Pt combined with a post H$_2$ thermal annealing process was used to prepare Pt$_3$Ti nanoparticle catalysts. Using ALD, atomic level control of the Pt and Ti loadings along with the superior wettability of Pt ALD precursors onto TiO$_2$ allowed leveraging of the strong metal support interactions occurring between these two species that led to the formation of Pt$_3$Ti alloys during the thermal annealing in H$_2$. The effect of annealing temperature was investigated, with the catalyst H$_2$-annealed at about 800° C. showing a Pt-based mass activity of about 1.84 mA/g$_{Pt}$ at about 0.9 V vs. RHE, representing more than about 2-fold improvement in ORR activity in comparison to pure Pt nanoparticles prepared by ALD and commercial Pt/Vulcan catalyst. Intrinsic activity improvements were indicated by the about 3-fold higher specific activity for the optimized ALD prepared Pt$_3$Ti catalyst in comparison a polycrystalline Pt electrode. Combined XPS, EXAFS, HRTEM, and SIMS characterization indicated the catalyst was comprised of a Pt$_3$Ti alloy with a Pt enriched surface. By correlating experimental observations with DFT calculations, it is confirmed that the improved ORR activity arises due to a combination of strain and ligand effects.

Example 5

Stepping up the Volcano: Precision Alloyed Oxygen Reduction Reaction Catalyst with Atomic Layer Deposition Overview Here this example reports a sub-layer Ti-rich Pt—Ti alloy catalyst identified by density functional theory (DFT) calculations and synthesized with atomic layer deposition (ALD). Catalytic models of Pt—Ti alloys with Ti enrichment in the sub-layer are found to have higher confidence level in significant catalytic activity enhancement. The corresponding Ti-rich sub-layer is obtained by adding a controllable amount of Ti alloy source on the catalyst surface using ALD. A remarkable specific activity of about 15 mA/cm$^2_{Pt}$ and mass activity of about 5.7 A/mg$_{Pt}$ @about 0.9 V vs. RHE is achieved, with Ti enriched catalyst surfaces verified.

INTRODUCTION

Polymer electrolyte membrane fuel cell (PEMFC) technology has progressed significantly over the past few decades for CO$_2$-free energy conversion and has undergone commercialization in a broad range of applications. However, the energy efficiency of PEMFCs is still far below the thermodynamic limit for numerous reasons. A major cause is the significant overpotential induced by the sluggish reaction kinetics of the oxygen reduction reaction (ORR) on the cathode. Platinum (Pt) is a high-performing metal catalyst for the ORR in the acidic environment. Despite that its relatively high activity, selectivity, and stability grant Pt a pervasive role over Pt-free catalysts, PEMFC vehicles currently use more than about 3 times of Pt than that used in internal combustion engine-powered vehicles. A variety of Pt group metal (PGM) catalyst designs such as nanostructured alloys, core-shell nanoparticles, and Pt-lanthanide alloys are considered for further improved catalytic performance on a Pt mass basis to address the cost and scarcity issues associated with the use of Pt.

There is significant room for intrinsic catalytic activity improvement over pure Pt, as Pt can over-bind oxygen intermediates relevant to ORR. Catalytic surfaces with an oxygen binding energy of about 0.0-0.4 eV weaker than a Pt (111) surface are predicted to result in higher ORR activity. Among metal alloy nanoparticles, Pt/Ni and Pt/Co alloys are identified as candidates most close to the optimal oxygen binding strength. Although their under-coordinated sites and intrinsic instability of alloying Co and Ni in acidic electrolytes make them more susceptible to dissolution, these alloy catalysts have demonstrated that changes in surface strain and ligand can favorably affect surface energetics and lead to more active systems. Therefore, it is desired that a tailored catalyst design and synthesis methodology are applied on finely controlling surface morphology using strain and ligand energetics, which could be applied to general Pt/transition metal alloy catalyst systems.

This example reports theory investigation and experimental synthesis of a Pt—Ti alloy catalyst with a Ti-rich sub-layer that favorably weakens oxygen binding energy and achieves a specific and mass activity of about 5 times that of polycrystalline Pt. Using insights from density functional theory (DFT), an understanding is gained of catalyst morphology that achieves a high performance on an otherwise less ORR active Pt—Ti alloy system. It is found that a Pt$_3$Ti alloy surface where Ti segregates into an immediate sub-layer under a Pt-skin is both energetically favorable over a bulk Pt$_3$Ti-terminated surface and weakens oxygen adsorption by about 0.1-0.2 eV. Calculated adsorption energies were supported by an uncertainty quantification metric within DFT that distinguishes between candidate surfaces with increased accuracy. Such structures with Ti-rich sub-layers are successfully realized by atomic layer deposition (ALD) where individual metal components are precisely layered for forming the target alloy. Within the optimized ALD sequence of layers comprised of deposited TiO$_2$/Pt/TiO$_2$ on a glassy carbon (GC) support, the capping TiO$_2$ layer allows the formation of a Ti-rich catalyst surface during the subsequent thermal treatment stage, which lead to close to optimal ORR activity. Below demonstrated is the experimental realization of this theory inspired catalytic structure with potential to contribute significantly towards catalyst discovery.

Results and Discussion

Figure 22:
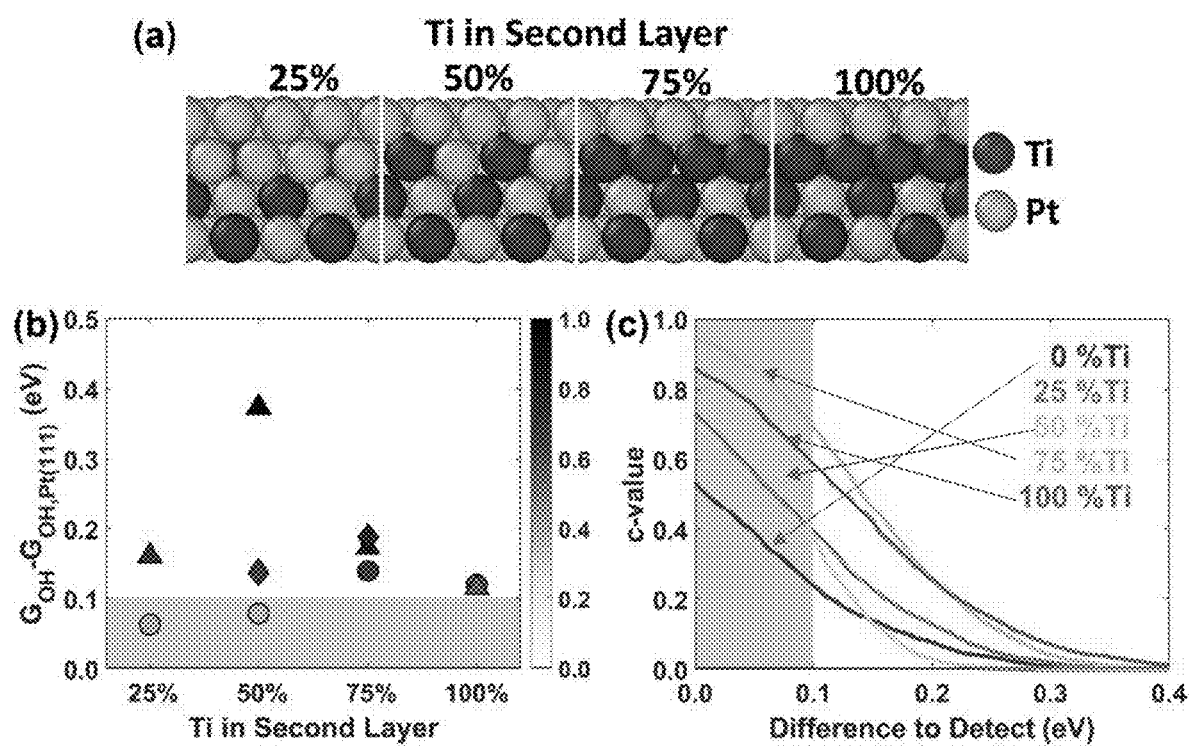
FIG. 22. (a) Concentration of Ti in a second layer of each Pt-skin slab model. (b) Free energy of adsorption of ¼ monolayer coverage of OH* relative to adsorption on Pt(111) surface is shown on sites 1 (circle), 2 (triangle) and 3 (diamond) corresponding to different surface sites. Marker shading on each $G_{OH}$ point is the confidence of predicting an adsorption energy 0.1 eV or more weaker (area shaded) than on the reference Pt surface. (c) Prediction confidence of adsorption energy weakened by a difference in energy on site 1 of each slab model.

A Pt$_3$Ti alloy with Pt-skin in (111) surface facet and with varying Ti concentration in a second layer, Ti$_{L2}$ as shown in FIG. 22a, was investigated using DFT. In this example comparison is made of adsorption energetics of active sites on each surface in FIG. 22b using free energy of OH adsorption G$_{OH}$, the descriptor with the highest prediction efficiency. All adsorption calculations are referenced to those on a Pt(111) surface. The G$_{OH}$ descriptor also captures the diversity of adsorption sites possible on each surface based on nearest neighbor ligand interactions. Most sites are predicted to weaken binding energy by about 0.1-0.2 eV compared to Pt(111) within a range of about 0.06 eV to about 0.39 eV.

Here assignment is made of a value for confidence of prediction (c-value) by using the Bayesian error estimation functional (BEEF-vdW) exchange-correlation (XC) functional during post-processing stages for each calculation to reflect uncertainties within the training data for XC-functionals. The c-value quantifies agreement within a BEEF energy ensemble to predict not only whether a catalyst binds oxygen weaker or stronger than another catalyst, but also by how much energy difference. For example, the theory-derived confidence of predicting that G$_{OH}$ on a surface with 75-100% Ti$_{L2}$ is weaker than on Pt(111) is c-value >0.86, which corresponds to a more than 86% agreement within DFT. Prediction confidence for a variable energy difference to detect is plotted in FIG. 1c. For an energy difference of 0.1 eV, the c-values decrease to about 0.6-0.7 for those same sites. On surfaces with lower Ti$_{L2}$ content, the c-value is <0.39. A high c-value signals good agreement within DFT that the surface of interest has weaker binding site than the corresponding site on reference Pt(111) at a given energy difference. Therefore, this metric provides a naturally robust approach to comparing adsorption sites by considering uncertainty within DFT. Shading of markers in FIG. 22b shows the confidence of predicting a weaker G$_{OH}$ by an energy difference of 0.1 eV. The region within 0-0.1 eV is shaded to help visualize the weakening of adsorption energy. Overall higher c-values are calculated for weakened oxygen adsorption on surfaces with greater Ti$_{L2}$ concentration which is likely due to increasing ligand effects. This insight gained by considering prediction accuracy of the energy difference indicates the Pt—Ti catalytic structure with a Ti-rich sub-layer can lead to higher ORR activity.

Figure 23:
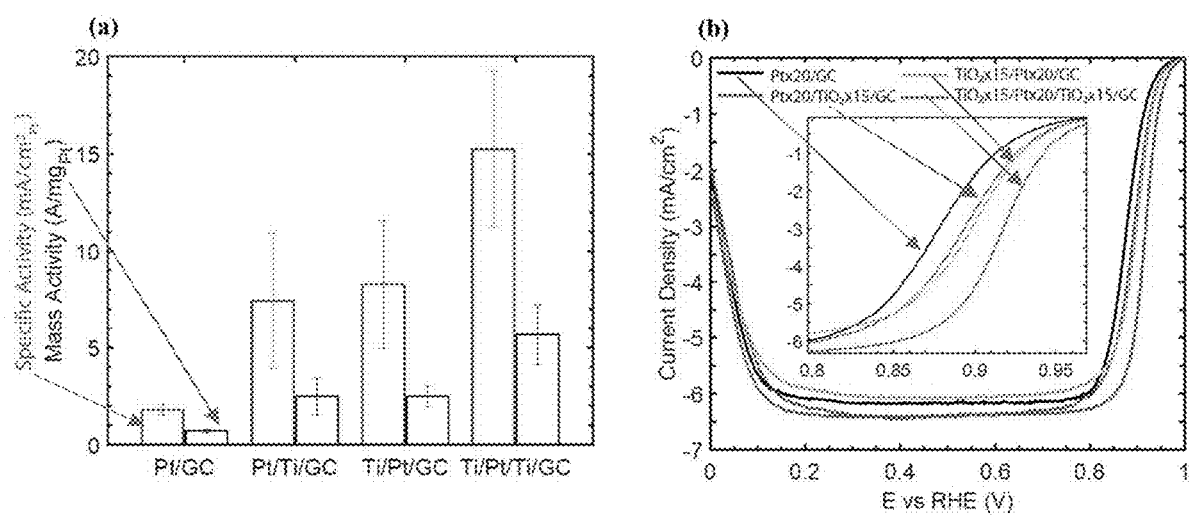
FIG. 23. (a) Summary of Pt-based mass activities and the specific activities at about 0.9 V vs. RHE for Pt×20/GC, Pt×20/$TiO_2$×15/GC, $TiO_2$×15/Pt×20/GC, $TiO_2$×15/Pt×20/$TiO_2$×15/GC. The average values and error bars were obtained as the standard deviation of measurements from five replicate samples. (b) Linear Sweep Voltammetry curves under $O_2$ saturated about 0.1 M $HClO_4$ electrolyte for above-mentioned catalysts.

To gain understanding of the effect of sub-layer Ti concentration experimentally, thin multi-layer catalysts were formed with ALD. Using ALD, laminate structures can be formed with precise position and dosage of materials as alloying sources. Three differently structured Pt—Ti catalysts were prepared by changing the ALD deposition sequence. The sample with TiO$_2$ deposited on glassy carbon (GC) followed by Pt deposition is denoted as Pt/Ti/GC, and Ti/Pt/Ti/GC stands for a structure with sequential deposition of TiO$_2$, Pt, followed by another TiO$_2$ layer on GC. Numbers by each deposition layer stand for the number of ALD cycles applied during deposition. For example, a TiO$_2$×15/Pt×20/GC structure was created with 20 cycles of Pt ALD deposited on GC, followed by another 15 cycles of ALD TiO$_2$. The as-deposited structures were annealed at about 650° C. to form alloys, with catalytic performance evaluated by rotating disk electrode (RDE) measurements. Their performance on the specific activity and mass activity @about 0.9 V vs. the reversible hydrogen electrode (RHE) are compared with the best class ALD-Pt in FIG. 23a. ALD of TiO$_2$ as either the top or bottom layer improves catalytic activities. This agrees with the theoretical calculations that the presence of Pt$_3$Ti alloy results in higher ORR activity than a Pt reference. However, the optimal structure is not reachable via a mere bottom or top layer of TiO$_2$, where diffusion driven by the concentration gradient of Ti can lead to a monotonic Ti profile from the top of catalyst surface to the bulk. With ALD, portioning is made of the available alloy sources for a structure with a Ti-rich sub-layer as discussed above. The TiO$_2$×15/Pt×20/TiO$_2$×15/GC sample was designed to allow Ti sources from both top and bottom layers to diffuse into the sandwiched Pt layer. The bottom TiO$_2$ is for the formation of Pt$_3$Ti alloy and the top TiO$_2$ layer is for the formation of a Ti-rich surface layer which is likely to form a Pt—Ti skin structure with a Ti-rich sub-layer during electrochemical testing. A specific activity of 15±3.8 mA/cm$^2_{Pt}$ is achieved. To consider possible changes in hydrogen adsorption behavior of alloys, CO-stripping was conducted on the structure with the highest catalytic activity, and the evaluated specific activity is confirmed to exceed about 10 mA/cm$^2$p$_t$. This optimal structure also demonstrates an average mass activity of 5.7±1.5 A/mg$_{Pt}$, an enhancement of almost 8-fold to that of Pt×20/GC with a mass activity of 0.72±0.13 A/mg$_{Pt}$. The ORR polarization of the four above-mentioned catalysts at a similar Pt mass loading are shown in FIG. 23b, where both Pt×20/TiO$_2$×15/GC and TiO$_2$×15/Pt×20/GC have a moderate but respectful half-wave potential Eva deviation compared to pure Pt ALD catalyst. A significant about 40 mV (E$_{1/2}$) shift can be noticed when comparing TiO$_2$×15/Pt×20/TiO$_2$×15/GC with Pt×20/GC.

Figure 24:
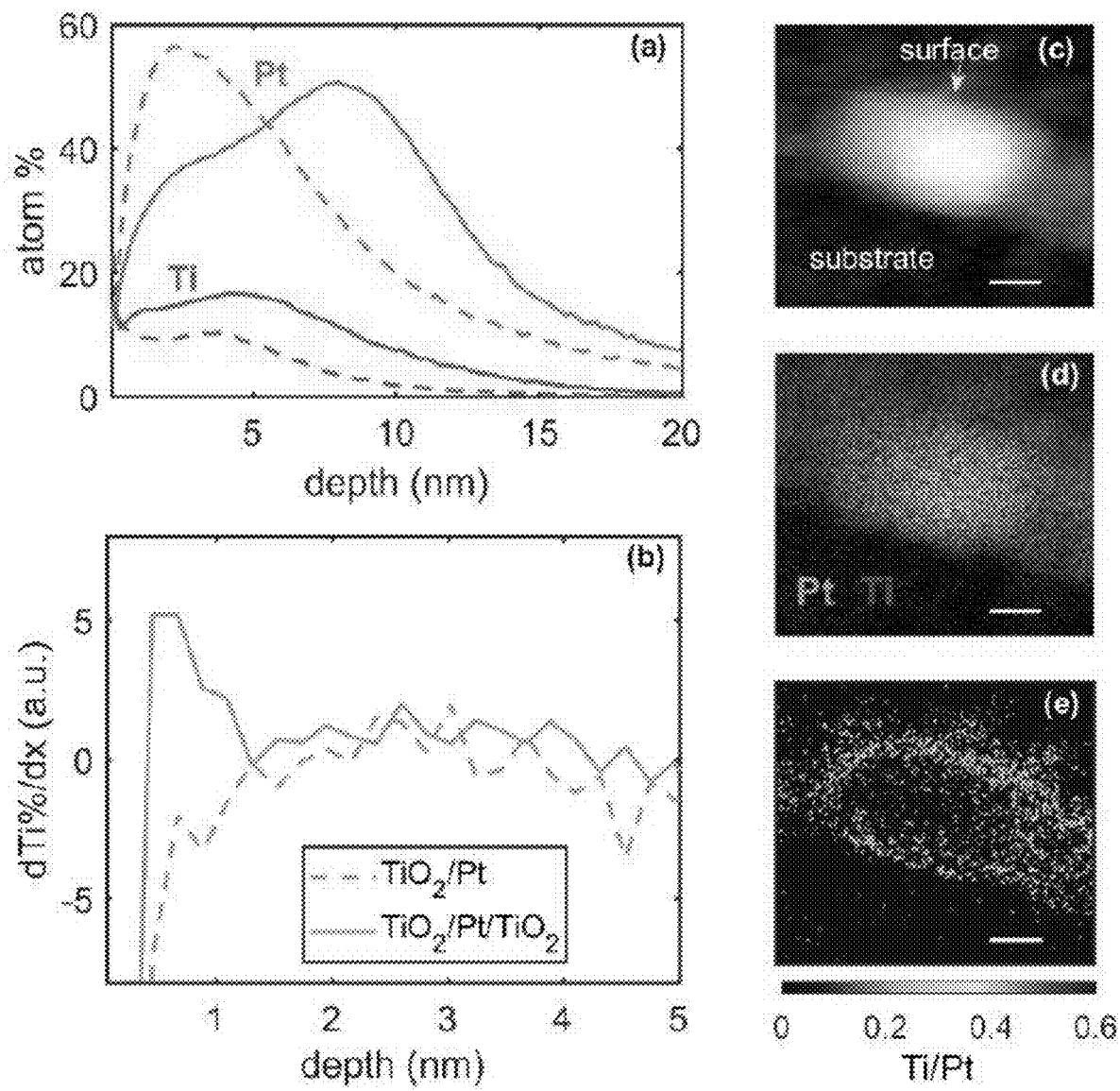
FIG. 24. (a) SIMS-measured atomic concentration evolution with respect to sputter depth of Pt and Ti in $TiO_2\times$15/Pt×20/$TiO_2$×15/GC (solid line) and $TiO_2$×15/Pt×20/GC (dashed line). (b) Differential of Ti concentration evolution with respect to sputter depth of Ti in $TiO_2$×15/Pt×20/$TiO_2$×15/GC (solid line) and $TiO_2$×15/Pt×20/GC (dashed line). (c) Cross-sectional scanning transmission electron microscopy (STEM) image of a $TiO_2$×15/Pt×20/$TiO_2$×15/GC nanoparticle with a glassy carbon substrate in the lower left part of the image and the surface of the nanoparticle facing the upper right corner, accompanied with the (d) electron energy loss spectroscopy (EELS) signals of Pt and Ti and (e) Ti/Pt ratio determined by the energy dispersive X-ray spectroscopy (EDS) signals of the same nanoparticle. The scale bars in (c) through (e) represent 2 nm.

To understand the performance enhancement by the Ti-rich sub-layer, dynamic secondary ion mass spectroscopy (SIMS) analysis is performed for the composition gradients of Pt and Ti in TiO$_2$×15/Pt×20/GC and TiO$_2$×15/Pt×20/TiO$_2$×15/GC samples, labelled as TiO$_2$/Pt and TiO$_2$/Pt/TiO$_2$ in FIG. 24a, respectively. Both samples were annealed and had undergone electrochemical tests with the same procedures applied on the samples with catalytic performance reported in FIG. 23. Within the first about 2 nm of sputtering, the part relevant to catalysis, the atomic concentration of Pt in TiO$_2$/Pt is higher than that in the TiO$_2$/Pt/TiO$_2$. An opposite trend is presented by the atomic concentration of Ti. The overall Ti/Pt ratio is higher in TiO$_2$/Pt/TiO$_2$ than in TiO$_2$/Pt, which is a result of the additional TiO$_2$ layer deposited by ALD as a surface alloying source. In the TiO$_2$/Pt sample, Pt is not fully covered by ALD TiO$_2$. A similar situation applies to TiO$_2$/Pt/TiO$_2$ where there can be TiO$_2$ deposited on TiO$_2$ layers that are not wetted by Pt. These fractions of TiO$_2$ with little Pt reduce to Ti during H$_2$ annealing and contributes to the depth profile, as shown by the high Ti sputter signals close to 0 nm. It is shown that the first-order differential of the Ti concentration with respect to sputter depth in FIG. 24b to deconvolute Ti in the Pt—Ti alloy from that in the Ti metal. The two samples show quite overlapped Ti evolution except for $TiO_2/Pt/TiO_2$ having a significant Ti enrichment close to the very surface, indicated by the peak at about 0.5 nm. To provide a complementary view of the Pt/Ti ratio in the particle, scanning transmission electron microscopy-electron energy loss spectroscopy (STEM-EELS) and STEM-energy dispersive X-ray spectroscopy (STEM-EDS) measurements are conducted on the cross-section of a $TiO_2/Pt/TiO_2$ nanoparticle. The center part of FIG. 24c showcases the cross-section of a catalyst nanoparticle. Due to that the thickness of the cross-section (about 40-50 nm) is greater than the thickness of the particle (about 5-7 nm), the particle in the field of view can be a projection of a few particles. The particle in FIG. 24c is relatively isolated with a noticeable overlapping particle on the right. As mentioned above, there are standalone Ti species, as one can tell from the Ti dominant regions in FIG. 24d. There is little oxygen from the EELS measurement and the higher resolution Ti K edge indicates the surface Ti is metallic. In the region where there is a good mixture of Pt and Ti, a higher Ti/Pt ratio can be found on the edges of the particle, indicating Ti enrichment on the surface of the particle. This localized view of STEM measurement confirms the global trend revealed by the SIMS depth profile that Ti enriches on the surface of the catalyst particles. The additional ALD $TiO_2$ layer on the top of the Pt makes such enrichment possible.

In summary, synthesis is made of highly ORR active Pt—Ti alloy catalysts inspired by the catalytic structure designed with DFT. The introduction of the c-value adds a quantitative, predictive power to the DFT calculations. By controlling the positions of alloying materials using ALD, target alloys with nonstoichiometric surfaces are successfully realized. Potentially applicable to various other catalytic reactions, this material design and prototyping process flow may facilitate the discovery of highly active alloy catalysts with performance approaching the theoretical limits.

As used herein, the singular terms "a," "an," and "the" may include plural referents unless the context clearly dictates otherwise. Thus, for example, reference to an object may include multiple objects unless the context clearly dictates otherwise.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the term "size" refers to a characteristic dimension of an object. Thus, for example, a size of an object that is spherical can refer to a diameter of the object. In the case of an object that is non-spherical, a size of the object can refer to a diameter of a corresponding spherical object, where the corresponding spherical object exhibits or has a particular set of derivable or measurable characteristics that are substantially the same as those of the non-spherical object. When referring to a set of objects as having a particular size, it is contemplated that the objects can have a distribution of sizes around the particular size. Thus, as used herein, a size of a set of objects can refer to a typical size of a distribution of sizes, such as an average size, a median size, or a peak size.

In the description of some embodiments, an object "on" another object can encompass cases where the former object is directly on (e.g., in physical contact with) the latter object, as well as cases where one or more intervening objects are located between the former object and the latter object.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A catalyst structure comprising:
   a substrate;
   a catalyst layer on the substrate, wherein the catalyst layer comprises a platinum group metal and has an average thickness of 8 nm or less; and
   an adhesion layer disposed between the substrate and the catalyst layer, wherein the adhesion layer has an average thickness of 3 nm or less and comprises at least one of a metal oxide or a metalloid oxide, the metal oxide or metalloid oxide having oxygen vacancies;
   wherein
   the adhesion layer comprises an intermixed region comprising an alloy of the platinum group metal and metal atoms from the metal oxide or metalloid oxide, wherein the platinum group metal occupies at least some of the oxygen vacancies; and
   wherein the intermixed region has a concentration gradient of the platinum group metal, wherein the platinum group metal in the intermixed region has a maximum concentration at an interface of the adhesion layer and the catalyst layer and a minimum concentration at 1 nm or less from an interface of the adhesion layer and the substrate.

2. The catalyst structure of claim 1, wherein an average thickness of the adhesion layer is 1 nm to 2 nm.

3. The catalyst structure of claim 1, wherein the catalyst layer is characterized by a lattice strain imparted by the adhesion layer.

4. The catalyst structure of claim 3, wherein the adhesion layer includes a crystalline phase.

5. The catalyst structure of claim 1, wherein the catalyst layer includes discrete regions that are spaced apart from one another, and at least one of the discrete regions includes a portion that is bonded to the substrate, and another portion that extends over the substrate and is spaced apart from the substrate by a gap.

6. The catalyst structure of claim 1, further comprising an over-layer on the catalyst layer.

7. The catalyst structure of claim 6, wherein an average thickness of the over-layer is 1 nm or less.

8. The catalyst structure of claim 6, wherein the over-layer provides partial surface coverage of the catalyst layer.

9. The catalyst structure of claim 6, wherein the catalyst layer includes a platinum group metal, and the over-layer includes an alloy of the platinum group metal and a material of the over-layer.

10. The catalyst structure of claim 6, wherein the catalyst layer includes a platinum group metal, and the over-layer includes at least one of a metal oxide, a metalloid oxide, a metal nitride, a metalloid nitride, a metal carbide, a metalloid carbide, a metal boride, a metalloid boride, a metal sulfide, a metalloid sulfide, a metal phosphide, a metalloid phosphide, a metal silicide, or a metalloid silicide.

11. The catalyst structure of claim 6, wherein a material of the catalyst layer at least partially extends into a region of the over-layer.

12. The catalyst structure of claim 1, wherein the minimum concentration of the platinum group metal in the intermixed region is at the interface of the adhesion layer and the substrate, such that the platinum group metal has direct contact with the substrate.

13. The catalyst structure of claim 1, wherein the platinum group metal is Pt.

14. The catalyst structure of claim 1, wherein the adhesion layer comprises $TiO_2$.

15. The catalyst structure of claim 1, wherein the intermixed region comprises a Pt—Ti alloy.

16. The catalyst structure of claim 15, wherein the Pt—Ti alloy comprises $Pt_3Ti$.

17. A membrane electrode assembly for a fuel cell, comprising a polymeric ion-conductive membrane and an electrocatalyst layer adjacent to the polymeric ion-conductive membrane, wherein the electrocatalyst layer includes the catalyst structure of claim 1.

18. A fuel cell comprising:
a cathode electrocatalyst layer;
an anode electrocatalyst layer; and
a polymeric ion-conductive membrane disposed between the cathode electrocatalyst layer and the anode electrocatalyst layer,
wherein at least one of the cathode electrocatalyst layer or the anode electrocatalyst layer includes the catalyst structure of claim 1.

19. A fuel cell comprising:
a first gas diffusion layer;
a second gas diffusion layer; and
a polymeric ion-conductive membrane disposed between the first gas diffusion layer and the second gas diffusion layer,
wherein at least one of the first gas diffusion layer or the second gas diffusion layer includes the catalyst structure of claim 1.

* * * * *